US012562098B2

(12) United States Patent　　(10) Patent No.:　US 12,562,098 B2

Oh et al.　　(45) Date of Patent:　Feb. 24, 2026

(54) DISPLAY APPARATUS AND DISPLAY PANEL

(71) Applicant: LG DISPLAY CO., LTD., Seoul (KR)

(72) Inventors: Min Woo Oh, Paju-si (KR); Chul Woo Im, Paju-si (KR); Moung O Kim, Paju-si (KR); Tae Hoon Lee, Paju-si (KR)

(73) Assignee: LG Display Co., Ltd. (KR)

( * ) Notice: Subject to any disclaimer, the term of this patent is extended or adjusted under 35 U.S.C. 154(b) by 0 days.

(21) Appl. No.: 18/658,115

(22) Filed: May 8, 2024

(65) Prior Publication Data

US 2025/0239203 A1　　Jul. 24, 2025

(30) Foreign Application Priority Data

Jan. 24, 2024　(KR) ........................ 10-2024-0010641

(51) Int. Cl.
　*G09G 3/20*　　(2006.01)
　*G09G 3/3233*　　(2016.01)
　*H10K 59/40*　　(2023.01)
　*H10K 59/80*　　(2023.01)

(52) U.S. Cl.
　CPC ......... *G09G 3/2096* (2013.01); *G09G 3/3233* (2013.01); *H10K 59/40* (2023.02); *H10K 59/873* (2023.02); *H10K 59/879* (2023.02); *H10K 59/8792* (2023.02); *G09G 2300/0426* (2013.01); *G09G 2300/0819* (2013.01); *G09G 2300/0842* (2013.01); *G09G 2300/0861* (2013.01); *G09G 2320/041* (2013.01); *G09G 2380/10* (2013.01)

(58) Field of Classification Search
　CPC ............... G09G 3/2096; G09G 3/3233; G09G 2300/0426; G09G 2300/0819; G09G 2300/0842; G09G 2300/0861; G09G 2320/041; G09G 2380/10; H10K 59/40; H10K 59/873; H10K 59/879; H10K 59/8792
　See application file for complete search history.

(56) References Cited

U.S. PATENT DOCUMENTS

| | | | | |
|---|---|---|---|---|
| 2005/0122305 A1* | 6/2005 | Murao | ................. | G09G 3/3648 |
| | | | | 345/101 |
| 2015/0054426 A1* | 2/2015 | Han | ...................... | G09G 3/3233 |
| | | | | 315/297 |
| 2020/0193904 A1* | 6/2020 | Kho | ...................... | G09G 3/3233 |
| 2021/0241693 A1* | 8/2021 | Hsieh | .................. | G09G 3/3258 |
| 2022/0215802 A1* | 7/2022 | Moriya | ............... | G09G 3/3233 |
| 2023/0043004 A1* | 2/2023 | Kwon | ...................... | G09G 3/32 |
| 2023/0215385 A1* | 7/2023 | Baek | .................... | H10K 59/131 |
| | | | | 345/204 |
| 2024/0069659 A1* | 2/2024 | Lim | ...................... | H10K 59/122 |
| 2024/0395202 A1* | 11/2024 | Kim | ...................... | H10K 59/131 |

* cited by examiner

*Primary Examiner* — Ryan A Lubit

(74) *Attorney, Agent, or Firm* — Fish & Richardson P.C.

(57)　　　ABSTRACT

A display apparatus includes a display panel including a plurality of unit subpixels disposed at a display area and a plurality of sensing subpixels disposed at a non-display area, a data driving circuit configured to supply data voltages to the display panel, and a timing controller configured to detect temperatures of the display panel by threshold voltages sensed in the plurality of sensing subpixels and transmit image data applied compensation values depending on the temperatures of the display panel.

18 Claims, 18 Drawing Sheets

DISPLAY APPARATUS AND DISPLAY PANEL

CROSS-REFERENCE TO RELATED APPLICATION

This application claims the priority of Korean Patent Application No. 10-2024-0010641, filed on Jan. 24, 2024, which is hereby incorporated by reference in its entirety.

BACKGROUND

Field of the Disclosure

The present disclosure relates to a display apparatus and a display panel.

Description of the Background

Representative display apparatuses for displaying an image based on digital data include liquid crystal display (LCD) apparatuses using liquid crystal and organic light emitting display apparatuses using organic light emitting diodes OLEDs.

Among these display apparatuses, organic light emitting display apparatuses use light emitting diodes that emit light on their own, so they have advantages in terms of fast response speed, contrast ratio, luminous efficiency, luminance, and viewing angle. In this case, the light emitting diode may be implemented as an inorganic or organic material.

SUMMARY

The organic light emitting display apparatus may include light emitting diodes disposed in each of a plurality of subpixels arranged on a display panel, and may control a luminance expressed by subpixels and display images by controlling the voltage flowing through the light emitting diodes and thereby emitting light in each light emitting diode. A threshold voltage of the light emitting element (or light emitting diode) disposed on the display panel may vary depending on a temperature of the display panel.

Accordingly, the present disclosure is to provide a display apparatus and a display panel capable of more accurately detecting a driving temperature for each location.

More specially, the present disclosure is to provide a display apparatus and a display panel capable of detecting a driving temperature for each location using a plurality of sensing subpixels disposed in a non-display area.

The present disclosure is also to provide a display apparatus and a display panel capable of effectively detecting driving temperatures corresponding to locations using threshold voltages of the sensing subpixels.

Further, the present disclosure is to provide a display apparatus and a display panel capable of supplying a compensated data voltage to a corresponding area by reflecting a driving temperature for each location detected through sensing subpixels.

Additional features and advantages of the disclosure will be set forth in the description which follows and in part will be apparent from the description, or may be learned by practice of the disclosure. Other advantages of the present disclosure will be realized and attained by the structure particularly pointed out in the written description and claims hereof as well as the appended drawings.

To achieve these and other advantages and in accordance with the present disclosure, as embodied and broadly described, a display apparatus includes a display panel including a plurality of unit subpixels disposed at a display area and a plurality of sensing subpixels disposed at a non-display area, a data driving circuit configured to supply data voltages to the display panel, and a timing controller configured to detect temperatures of the display panel by threshold voltages sensed in the plurality of sensing subpixels and transmit image data applied compensation values based on the temperatures of the display panel.

Various aspects of the present disclosure may provide a display panel comprising a plurality of unit subpixels disposed at a display area, and a plurality of sensing subpixels disposed at a non-display area, and temperatures may be detected by a threshold voltage sensed in the plurality of sensing subpixels, and data voltages compensated based on the temperatures may be supplied to the plurality of unit subpixels.

According to various aspects of the present disclosure, it has an effect capable of detecting more accurately a driving temperature for each location.

According to various aspects of the present disclosure, it has an effect capable of detecting a driving temperature for each location by a plurality of sensing subpixels disposed at a non-display area.

According to various aspects of the present disclosure, it has an effect capable of detecting driving temperatures corresponding to locations at a low power using threshold voltages of the sensing subpixels.

According to various aspects of the present disclosure, it has an effect capable of supplying a compensated data voltage to a corresponding area by reflecting a driving temperature for each location detected through sensing subpixels.

According to aspects of the present disclosure, it is possible to reduce a size and weight of the display panel since a driving temperature of a display panel may be detected through sensing subpixels without using a temperature sensor.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain principles of the disclosure.

In the drawings:

FIG. 2 illustrates a configuration of a display apparatus according to aspects of the present disclosure.

DETAILED DESCRIPTION

Figure 1:
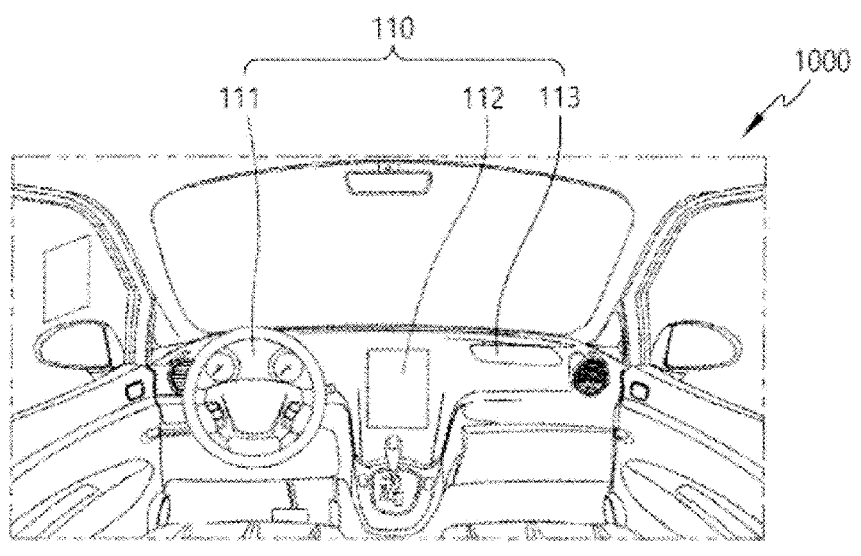
FIG. 1 illustrates a vehicle system including a display apparatus according to aspects of the present disclosure.

Reference is now made in detail to aspects of the present disclosure, examples of which may be illustrated in the accompanying drawings. In the following description, when a detailed description of well-known functions, structures or configurations may unnecessarily obscure aspects of the present disclosure, a detailed description of such known functions or configurations may be omitted for brevity. Further, repetitive descriptions may be omitted for brevity. The progression of processing steps and/or operations described is a non-limiting example.

The sequence of steps and/or operations is not limited to that set forth herein and may be changed to occur in an order that is different from an order described herein, with the exception of steps and/or operations necessarily occurring in a particular order. In one or more examples, two operations in succession may be performed substantially concurrently, or the two operations may be performed in a reverse order or in a different order depending on a function or operation involved.

Unless stated otherwise, like reference numerals may refer to like elements throughout even when they are shown in different drawings. In one or more aspects, identical elements (or elements with identical names) in different drawings may have the same or substantially the same functions and properties unless stated otherwise. Names of the respective elements used in the following explanations are selected only for convenience and may be thus different from those used in actual products.

Advantages and features of the present disclosure, and implementation methods thereof, are clarified through the aspects described with reference to the accompanying drawings. The present disclosure may, however, be embodied in different forms and should not be construed as limited to the example aspects set forth herein. Rather, these example aspects are examples and are provided so that this disclosure may be thorough and complete to assist those skilled in the art to understand the inventive concepts without limiting the protected scope of the present disclosure.

Shapes (e.g., sizes, lengths, widths, heights, thicknesses, locations, radii, diameters, and areas), dimensions, ratios, angles, numbers, and the like disclosed herein, including those illustrated in the drawings, are merely examples, and thus, the present disclosure is not limited to the illustrated details. Any implementation described herein as an "example" is not necessarily to be construed as preferred or advantageous over other implementations. It is, however, noted that the relative dimensions of the components illustrated in the drawings are part of the present disclosure.

Where a term like "comprise," "have," "include," "contain," "constitute," or the like is used with respect to one or more other elements, one or more other elements may be added unless a term, such as "only" or the like is used. The terms used in the present disclosure are merely used to describe example aspects, and are not intended to limit the scope of the present disclosure. The terms of a singular form may include plural forms unless the context clearly indicates otherwise.

The word "exemplary" is used to mean serving as an example or illustration, unless otherwise specified. Aspects are example aspects. "Aspects," "examples," and the like should not be construed as preferred or advantageous over other implementations. An aspect, an example, an example aspect, or the like may refer to one or more aspects, one or more examples, one or more example aspects, or the like, unless stated otherwise. Further, the term "may" encompass all the meanings of the term "may."

In one or more aspects, unless explicitly stated otherwise, element, feature, or corresponding information (e.g., a level, range, dimension, size, or the like) is construed to include an error or tolerance range even where no explicit description of such an error or tolerance range is provided. An error or tolerance range may be caused by various factors (e.g., process factors, internal or external impact, noise, or the like). In interpreting a numerical value, the value is interpreted as including an error range unless explicitly stated otherwise.

In describing a positional relationship when the positional relationship between two parts (e.g., layers, films, regions, components, sections, or the like) is described, for example, using "on," "upon," "on top of," "over," "under," "above," "below," "beneath," "near," "close to," "adjacent to," "beside," "next to," "at or on a side of," or the like, one or more other parts may be located between the two parts unless a more limiting term, such as "immediate(ly)," "direct(ly)," or "close(ly)," is used. For example, where a structure is described as being positioned "on," "upon," "on top of," "over," "under," "above," "below," "beneath," "near," "close to," "adjacent to," "beside," "next to," "at or on a side of," or the like another structure, this description should be construed as including a case in which the structures contact each other as well as a case in which one or more additional structures are disposed or interposed therebetween. Furthermore, the terms "front," "rear," "back," "left," "right," "top," "bottom," "downward," "upward," "upper," "lower," "up," "down," "column," "row," "vertical," "horizontal," and the like refer to an arbitrary frame of reference.

Spatially relative terms, such as "below," "beneath," "lower," "on," "above," "upper" and the like, may be used to describe a correlation between various elements (e. g., layers, films, regions, components, sections, or the like) as shown in the drawings. The spatially relative terms are to be understood as terms including different orientations of the elements in use or in operation in addition to the orientation depicted in the drawings. For example, if the elements shown in the drawings are turned over, elements described as "below" or "beneath" other elements would be oriented "above" other elements. Thus, the term "below," which is an example term, may include all directions of "above" and "below." Likewise, an exemplary term "above" or "on" may include both directions of "above" and "below."

In describing a temporal relationship, when the temporal order is described as, for example, "after," "subsequent," "next," "before," "preceding," "prior to," or the like, a case that is not consecutive or not sequential may be included and thus one or more other events may occur therebetween, unless a more limiting term, such as "just," "immediate(ly)," or "direct(ly)," is used.

The terms, such as "below," "lower," "above," "upper" and the like, may be used herein to describe a relationship between element(s) as illustrated in the drawings. It will be understood that the terms are spatially relative and based on the orientation depicted in the drawings.

It is understood that, although the terms "first," "second," or the like may be used herein to describe various elements (e.g., layers, films, regions, components, sections, or the like), these elements should not be limited by these terms, for example, to any particular order, precedence, or number of elements. These terms are used only to distinguish one element from another. For example, a first element could be termed a second element, and, similarly, a second element could be termed a first element, without departing from the scope of the present disclosure. Furthermore, the first element, the second element, and the like may be arbitrarily named according to the convenience of those skilled in the art without departing from the scope of the present disclosure. For clarity, the functions or structures of these elements (e.g., the first element, the second element and the like) are not limited by ordinal numbers or the names in front of the elements. Further, a first element may include one or more first elements. Similarly, a second element or the like may include one or more second elements or the like.

In describing elements of the present disclosure, the terms "first," "second," "A", "B", "(a)", or "(b)", or the like may be used. These terms are intended to identify the corresponding element(s) from the other element(s), and these are not used to define the essence, basis, order, or number of the elements.

For the expression that an element (e. g., layer, film, region, component, section, or the like) is described as "connected," "coupled," "attached," "adhered," or the like to another element, the element may not only be directly connected, coupled, attached, adhered, or the like to another element, but also be indirectly connected, coupled, attached, adhered, or the like to another element with one or more intervening elements disposed or interposed between the elements, unless otherwise specified.

For the expression that an element (e. g., layer, film, region, component, section, or the like) "contacts," "overlaps," or the like with another element, the element may not only directly contact, overlap, or the like with another element, but also indirectly overlap, or the like with another element with one or more intervening elements disposed or interposed between the elements, unless otherwise specified.

The phrase that an element (e.g., layer, film, region, component, section, or the like) is "provided in," "disposed in," or the like in another element may be understood as that at least a portion of the element is provided in, disposed in, or the like in another element, or that the entirety of the element is provided in, disposed in, or the like in another element. The phrase that an element (e.g., layer, film, region, component, section, or the like) "contacts," "overlaps," or the like with another element may be understood as that at least a portion of the element contacts, overlaps, or the like with a least a portion of another element, that the entirety of the element contacts, overlaps, or the like with a least a portion of another element, or that at least a portion of the element contacts, overlaps, or the like with the entirety of another element.

The terms such as a "line" or "direction" should not be interpreted only based on a geometrical relationship in which the respective lines or directions are parallel or perpendicular to each other. Such terms may mean a wider range of lines or directions within which the components of the present disclosure may operate functionally. For example, the terms "first direction," "second direction," and the like, such as a direction parallel or perpendicular to "x-axis," "y-axis," or "z-axis," should not be interpreted only based on a geometrical relationship in which the respective directions are parallel or perpendicular to each other, and may be meant as directions having wider directivities within the range within which the components of the present disclosure may operate functionally.

The term "at least one" should be understood as including any and all combinations of one or more of the associated listed items. For example, each of the phrases of "at least one of a first item, a second item, or a third item" and "at least one of a first item, a second item, and a third item", may represent (i) a combination of items provided by one or more of the first item, the second item, and the third item and (ii) only one of the first item, the second item, and the third item.

The expression of a first element, a second elements, "and/or" a third element should be understood to encompass one of the first, second, or third elements, one of the first, second, and third elements, as well as any and all combinations of the first, second and third elements. By way of example, A, B and/or C encompass only A; only B; only C; any of A, B, and C (e. g., A, B, or C); some combinations of A, B, and C (e. g., A and B; A and C; or B and C); and all of A, B, and C. Furthermore, an expression "A/B" may be understood as A and/or B. For example, an expression "A/B" may refer to only A; only B; A or B; or A and B.

In one or more aspects, the terms "between" and "among" may be used interchangeably simply for convenience unless stated otherwise. For example, an expression "between a plurality of elements" may be understood as among a plurality of elements. In another example, an expression "among a plurality of elements" may be understood as between a plurality of elements. In one or more examples, the number of elements may be two. In one or more examples, the number of elements may be more than two. Furthermore, when an element (e.g., layer, film, region, component, sections, or the like) is referred to as being "between" at least two elements, the element may be the only element between the at least two elements, or one or more intervening elements may also be present.

In one or more aspects, the phrases "each other" and "one another" may be used interchangeably simply for convenience unless stated otherwise. For example, an expression "different from each other" may be understood as different from one another. In another example, an expression "different from one another" may be understood as different from each other. In one or more examples, the number of elements involved in the foregoing expression may be two. In one or more examples, the number of elements involved in the foregoing expression may be more than two.

In one or more aspects, the phrases "one or more among" and "one or more of" may be used interchangeably simply for convenience unless stated otherwise.

The term "or" means "inclusive or" rather than "exclusive or." For example, unless otherwise stated or clear from the context, the expression that "x uses a or b" means any one of natural inclusive permutations. For example, "a or b" may mean "a," "b," or "a and b." For example, "a, b or c" may mean "a," "b," "c," "a and b," "b and c," "a and c," or "a, b and c."

Features of various aspects of the present disclosure may be partially or entirely coupled to or combined with each other, may be technically associated with each other, and may be operated, linked, or driven together in various ways. Aspects of the present disclosure may be implemented or carried out independently from each other, or may be implemented or carried out together in a co-dependent or related relationship. In one or more aspects, the components of each apparatus according to various aspects of the present disclosure may be operatively coupled and configured.

Unless otherwise defined, the terms (including technical and scientific terms) used herein have the same meaning as commonly understood by one of ordinary skill in the art to which example aspects belong. It should be further understood that terms, such as those defined in commonly used dictionaries, should be interpreted as having a meaning, for example, consistent with their meaning in the context of the relevant art and should not be interpreted in an idealized or overly formal sense, unless expressly defined otherwise herein.

The terms used herein have been selected as being general in the related technical field; however, there may be other terms depending on the development and/or change of technology, convention, preference of technicians, and so on. Therefore, the terms used herein should not be understood as limiting technical ideas, but should be understood as examples of the terms for describing example aspects.

Further, in a specific case, a term may be arbitrarily selected by an applicant, and in this case, the detailed meaning thereof is described herein. Therefore, the terms used herein should be understood based on not only the name of the terms, but also the meaning of the terms and the content hereof.

"X-axis direction", "Y-axis direction" and "Z-axis direction" should not be construed by a geometric relation only of a mutual vertical relation and may have broader directionality within the range that elements of the present disclosure may act functionally.

In the following description, various example aspects of the present disclosure are described in detail with reference to the accompanying drawings. With respect to reference numerals to elements of each of the drawings, the same elements may be illustrated in other drawings, and like reference numerals may refer to like elements unless stated otherwise. The same or similar elements may be denoted by the same reference numerals even though they are depicted in different drawings. In addition, for convenience of description, a scale, dimension, size, and thickness of each of the elements illustrated in the accompanying drawings may be different from an actual scale, dimension, size, and thickness, and thus, aspects of the present disclosure are not limited to a scale, dimension, size, and thickness illustrated in the drawings.

Hereinafter, various aspects of the disclosure will be described in detail with reference to the accompanying drawings.

FIG. 1 illustrates a vehicle system including a display apparatus according to aspects of the present disclosure. All components of each display apparatus according to all aspects of the present disclosure are operatively coupled and configured.

Referring to FIG. 1, the interior of the vehicle system 1000 according to aspects of the present disclosure may include a driver's seat, a passenger's seat, a dashboard, which has various instruments necessary for driving, disposed in front of the driver's seat and passenger's seat, and a center fascia with a control plate for electronic apparatuses The dashboard may include a first display panel 111 configured to display information necessary for driving, including a speedometer. The first display panel 111 may be referred to as a dashboard display panel.

The first display panel 111 is a display panel for allowing the vehicle system 1000 to be driven safely by transmitting information for the driving status of the vehicle system 1000 and the operation of various electronic apparatuses installed in the vehicle system 1000 to the driver. The first display panel 111 disposed behind the steering wheel relative to the driver's seat may include a speedometer for indicating a driving speed, a tripmeter for indicating a driving distance, a tachometer for indicating engine rotation speed, a fuel gauge, a water temperature gauge, an engine temperature gauge, and various warning lamps.

The center fascia may be disposed between the driver's seat and the passenger's seat, and may correspond to the area where the dashboard and shift lever meet vertically. An audio, an air conditioner, a heater controller, a navigator, an air vent, a cigar jack, an ashtray, a cup holder, etc., may be disposed on the center fascia. Additionally, the center fascia may include a second display panel 112.

The second display panel 112 may display a route to the destination or display a map image corresponding to a current location, and may display a user interface related to the control of various electronic apparatuses in the vehicle system 1000. Additionally, when the vehicle system 1000 is connected to a mobile apparatus, a screen provided by the mobile apparatus may be displayed in the second display panel 112.

The second display panel 112 located between the driver's seat and the passenger's seat of the vehicle system 1000 may be referred to as a center fascia display panel.

Further, a third display panel 113 may be further disposed on the front of the passenger's seat for the convenience of passengers. The third display panel 113 located on the passenger's seat may be referred to as the passenger display panel.

Moreover, the display panel 110 may further include at least one of a front window display panel, a side mirror display panel, a rear mirror display panel and a side window display panel in addition to the dashboard display panel 111, a center fascia display panel 112, and the passenger display panel 113. Further, various types of display panels may be more installed or disposed.

The front window display panel may be a display panel that projects a virtual image on a partial area of the front window that may see through a front of the vehicle system 1000. By displaying a vehicle speed, a remaining fuel, and route information through the front window display panel, it may minimize the driver's unnecessary shifting of gaze elsewhere.

The side mirror display panel may be a display panel that may display a side image captured through a side camera on a partial or entire area of a side mirror to view the side of the vehicle system 1000. Therefore, the driver may check not only the side image reflected through the side mirror, but also the side image captured through the side camera through the side mirror display panel.

The rear mirror display panel may be a display panel that may display a rear image captured through a rear camera on a partial or an entire area of a rear mirror to view the rear of the vehicle system 1000. Therefore, the driver may check not only the rear image reflected through the rear mirror, but also the rear image captured through the rear camera through the rear mirror display panel.

The side window display panel may be a display panel for projecting a virtual image on a partial area of the side window that may see through the side of the vehicle system 1000. Various information for the vehicle system 1000 may be displayed through the side window display panel.

Figure 2:
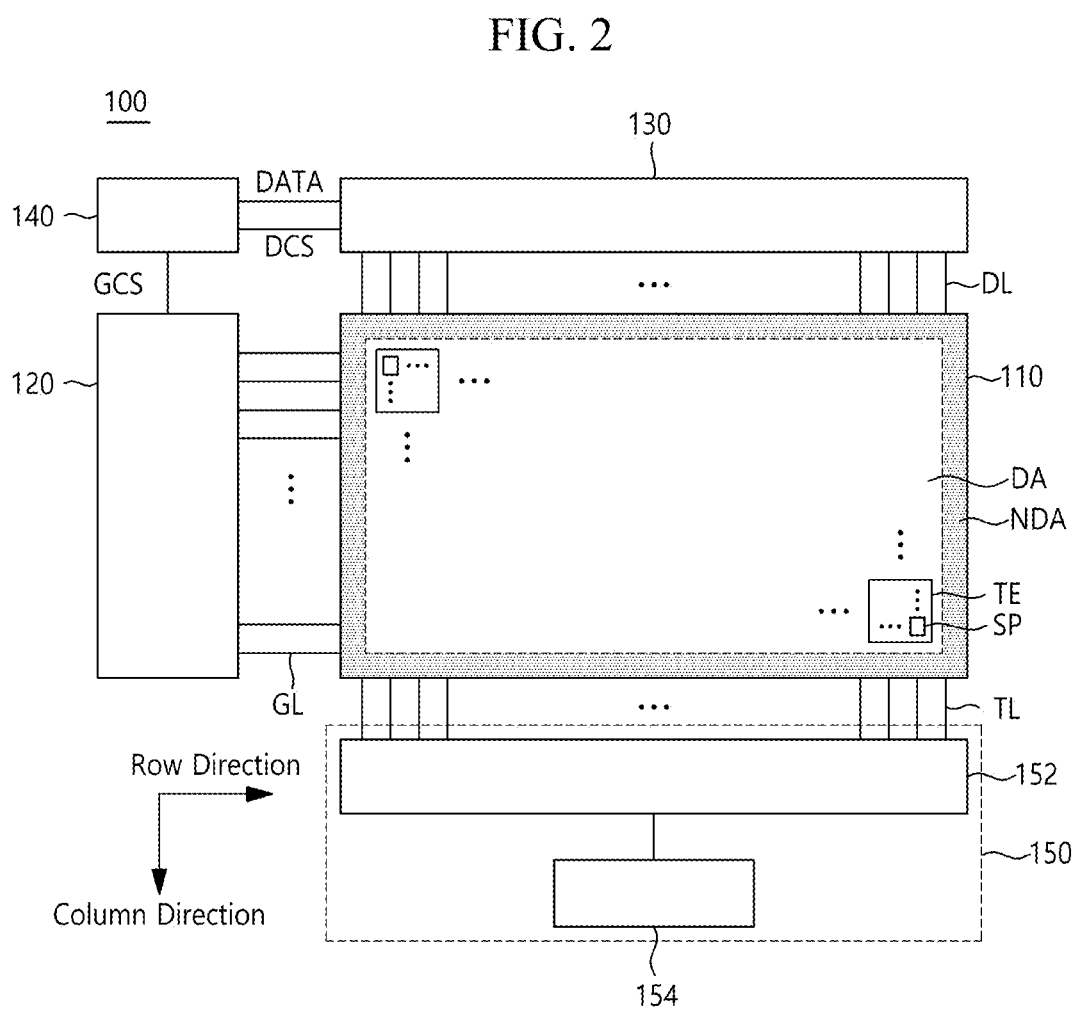

FIG. 2 illustrates a configuration of a display apparatus according to aspects of the present disclosure.

Referring to FIG. 2, a display apparatus 100 according to aspects of the present disclosure may include a display panel 110, a data driving circuit 130, a gate driving circuit 120, and a timing controller 140 as components configured to display images.

The display panel 110 may include a dashboard display panel 111, a center fascia display panel 112, and a passenger display panel 113, but aspects of the present disclosure are not limited thereto.

The display panel 110 may include a display area DA in which images are displayed and a non-display area NDA in which no image is displayed.

The non-display area NDA may be an outer area of the display area DA and be referred to as a bezel area. The non-display area NDA may be an area visible from the front of the display apparatus 100 or an area that is bent and not visible from the front of the display apparatus 100.

The display panel 110 may include a plurality of subpixels SP. For example, the display apparatus 100 may be various types of display apparatuses including a liquid crystal display apparatus, an organic light emitting display apparatus, a micro light emitting diode (micro LED) display apparatus, and a quantum dot display apparatus, but aspects of the present disclosure are not limited thereto.

The structure of each of the plurality of subpixels SP may vary according to a type of the display apparatus 100. For example, when the display apparatus 100 is a self-emission display apparatus in which the subpixels SP emit light by themselves, each subpixel SP may include a light emitting element that emits light by itself, one or more transistors, and one or more capacitors.

The display panel 110 may further include various types of signal lines to drive the plurality of subpixels SP. For example, various types of signal lines may include a plurality of data lines DL transferring data signals (also referred to as data voltages or image data) and a plurality of gate lines GL transferring gate signals (also referred to as scan signals or emission signals).

The plurality of data lines DL and the plurality of gate lines GL may cross each other. Each of the plurality of data lines DL may be disposed to be extending in a column direction. Each of the plurality of gate lines GL may be disposed to be extending in a row direction.

Here, the column direction and the row direction are relative. For example, the column direction may be a vertical direction and the row direction may be a horizontal direction. As another example, the column direction may be a horizontal direction and the row direction may be a vertical direction. But aspects of the present disclosure are not limited thereto.

The data driving circuit 130 may be a circuit configured to drive the plurality of data lines DL. The data driving circuit 130 may supply data signals to the plurality of data lines DL. The gate driving circuit 120 may be a circuit configured to drive the plurality of gate lines GL. The gate driving circuit 120 may supply gate signals to the plurality of gate lines GL.

The timing controller 140 may control the data driving circuit 130 and the gate driving circuit 120. The timing controller 140 may control driving timings for the plurality of data lines DL and driving timings for the plurality of gate lines GL.

The timing controller 140 may supply various types of data driving control signals DCS to the data driving circuit 130 to control the data driving circuit 130 and may supply various types of gate driving control signals GCS to the gate driving circuit 230 to control the gate driving circuit 120.

The data driving circuit 130 may supply data voltages to the plurality of data lines DL according to the driving timing control by the timing controller 140. The data driving circuit 130 may receive digital image data DATA from the timing controller 140 and may convert the received image data DATA into analog data voltages and output them to the plurality of data lines DL.

The gate driving circuit 120 may supply gate signals to the plurality of gate lines GL according to the timing control of the timing controller 140. The gate driving circuit 120 may receive a first gate voltage corresponding to a turn-on level voltage and a second gate voltage corresponding to a turn-off level voltage, along with various gate driving control signals GCS, generate gate signals, and supply the generated gate signals to the plurality of gate lines GL. The turn-on level voltage may be a high level voltage, and the turn-off level voltage may be a low level voltage. In another example, the turn-on level voltage may be a low level voltage, and the turn-off level voltage may be a high level voltage.

The gate driving circuit 120 may include one or more gate driving integrated circuits (GDIC). The gate driving circuit 120 may be located on only one side (or one portion) or both sides (or both portions) of the display panel 110 based on the driving method. Alternatively, the gate driving circuit 120 may be a Gate In Panel (GIP) formed directly in the non-display area NDA of the display panel 110.

To provide a touch sensing function as well as an image display function, the display apparatus 100 may include a touch screen panel and a touch circuit 150 that senses the touch screen panel to detect whether a touch occurs by a touch object, such as a finger or pen, or the position of the touch.

The touch circuit 150 may include a touch driving circuit 152 that drives and senses the touch screen panel and generates and outputs touch sensing data and a touch controller 154 that may detect an occurrence of a touch or the position of the touch using touch sensing data.

The touch screen panel may include a plurality of touch electrodes TE as touch sensors. The touch screen panel may further include a plurality of touch lines TL for electrically connecting the plurality of touch electrodes TE and the touch driving circuit 152. The touch screen panel or touch electrode TE is also referred to as a touch sensor.

The touch screen panel may be disposed outside or inside the display panel 110. When the touch screen panel exists outside the display panel 110, the touch screen panel is referred to as an external-type touch screen panel. When the touch screen panel is of the external-type, the touch screen panel and the display panel 110 may be separately manufactured and may be combined (or coupled). The external-type touch screen panel may include a substrate and a plurality of touch electrodes TE on the substrate.

When the touch screen panel provides inside the display panel 110, the touch screen panel is referred to as an internal-type touch screen panel. In the internal-type touch screen panel, the touch screen panel may be formed in the display panel 110 during a manufacturing process of the display panel 110.

The touch driving circuit 152 may supply a touch driving signal to at least one of the plurality of touch electrodes TE and detect a touch sensing signal transferred from at least one touch electrode TE among the plurality of touch electrodes TE, generating touch sensing data.

The touch circuit 150 may perform touch sensing in a self-capacitance sensing scheme or a mutual-capacitance sensing scheme.

When the touch circuit 150 performs touch sensing in the self-capacitance sensing scheme, the touch circuit 150 may perform touch sensing based on capacitance between each touch electrode TE and the touch object (e.g., finger or pen).

When the touch circuit 150 performs touch sensing in the mutual-capacitance sensing scheme, the touch circuit 150 may perform touch sensing based on capacitance between the touch electrodes TE.

According to the mutual-capacitance sensing scheme, the plurality of touch electrodes TE are divided into driving touch electrodes and sensing touch electrodes. The touch driving circuit 152 may drive the driving touch electrode by the touch driving signal and may detect the touch sensing signal from the sensing touch electrode.

According to the self-capacitance sensing scheme, each of the plurality of touch electrodes TE may serve both as a driving touch electrode and as a sensing touch electrode. The touch driving circuit 152 may drive all or some of the plurality of touch electrodes TE and sense all or some of the plurality of touch electrodes TE.

The touch driving circuit 152 and the touch controller 154 may be implemented as separate devices or as a single device.

In another example, the touch driving circuit 152 and the data driving circuit 130 may be implemented as separate integrated circuits. In another example, the whole or part of the touch driving circuit 152 and the whole or part of the data driving circuit 130 may be integrated into a single integrated circuit.

The display apparatus 100 according to aspects of the present disclosure may be a self-emissive display apparatus having self-emissive light emitting elements disposed on the display panel 110, such as an organic light emitting display apparatus, a quantum dot display apparatus, a micro LED display apparatus, but aspects of the present disclosure are not limited thereto.

Figure 3:
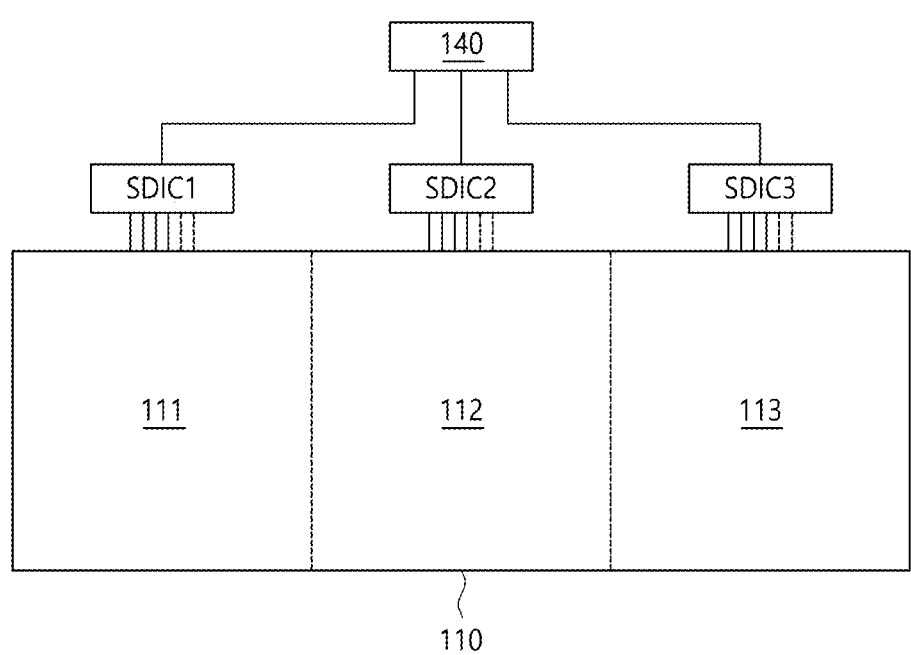
FIG. 3 illustrates a structure configured to drive a plurality of display panels according to aspects of the present disclosure.

FIG. 3 illustrates a structure configured to drive a plurality of display panels according to aspects of the present disclosure.

Referring to FIG. 3, the display apparatus 100 according to aspects of the present disclosure may include one or more display panels 111, 112, 113, a timing controller 140, and one or more source driving integrated circuits SDIC1, SDIC2, SDIC3.

The one or more display panels may be at least one or more of the first display panel 111, the second display panel 112, and the third display panel 113. The first display panel 111 may be a dashboard display panel, the second display panel 112 may be a center fascia display panel, and the third display panel 113 may be a passenger display panel.

The first source driving integrated circuit SDIC1 may supply a first data voltage to the first display panel 111. The second source driving integrated circuit SDIC2 may supply a second data voltage to the second display panel 112. The third source driving integrated circuit SDIC3 may supply a third data voltage to the third display panel 113.

The timing controller 140 may receive external timing signals such as a vertical synchronization signal Vsync, a horizontal synchronization signal Hsync, a data enable signal DE and main clock MCLK, etc., and image data DATA from the host system through an interface such as low voltage differential signaling LVDS interface.

The timing controller 140 may generate control signals for the operation of the gate driving circuit 120 and the data driving circuit 130 based on the external timing signals, and supply the image data DATA to the source driving integrated circuits SDIC1-SDIC3 constituting the data driving circuit 130.

The timing controller 140 may receive coordinates of important information from the host system and calculate a checksum to check for errors in the image data DATA based on the coordinates of the important information.

When the display apparatus 100 displays vehicle-related information, the important information may be information configured to display vehicle warnings such as safety control off, temperature caution, anti-lock brake system (ABS), lack of hydraulic pressure, etc., but aspects of the present disclosure are not limited thereto.

The timing controller 140 transmits the coordinates and checksum of important information to the source driving integrated circuits SDIC1-SDIC3, respectively.

After this, the timing controller 140 may receive feedback on whether there is an error in the image data DATA from the source driving integrated circuits SDIC1-SDIC3 through a specific interface. Additionally, the timing controller 140 may also receive feedback on whether there is an error in the communication state from the source driving integrated circuits SDIC1-SDIC3.

Based on the feedback results, the timing controller 140 may determine whether an error has occurred in the communication state or an abnormal image is displayed in the source driving integrated circuits SDIC1-SDIC3.

Each source driving integrated circuit SDIC1-SDIC3 converts the image data DATA received from the timing controller 140 into an analog data voltage and supplies it to corresponding display panel 111-113 through data lines.

The first source driving integrated circuit SDIC1 may supply the data voltage through a data line connected to the first display panel 111, the second source driving integrated circuit SDIC2 may supply the data voltage through a data line connected to the second display panel 112, and the third source driving integrated circuit SDIC3 may supply the data voltage through a data line connected to the third display panel 113.

At this time, first subpixels and second subpixels with different emission angles may be arranged together in at least one display panel 111-113. The display apparatus 100 may control the viewing angle of image by selectively controlling driving operations of the first subpixels or the second subpixels.

For above purpose, a plurality of unit subpixels may be disposed on the display area of the each display panel 111-113.

The unit subpixel may be a subpixel that emits light of a specified color. The unit subpixel may include a first subpixel with a first emission angle and a second subpixel with a second emission angle. The unit subpixel may be a unit subpixel that emits red color, a unit subpixel that emits green color, or a unit subpixel that emits blue color.

Figure 4:
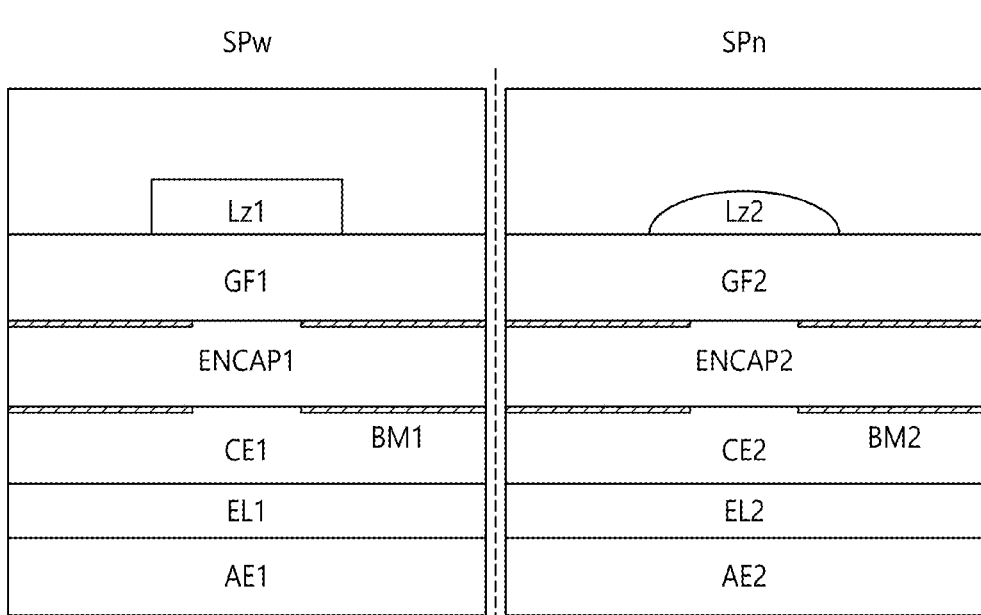
FIG. 4 is a cross-sectional diagram of a unit subpixel according to aspects of the present disclosure.

FIG. 4 is a cross-sectional diagram of a unit subpixel according to aspects of the present disclosure.

Referring to FIG. 4, the unit subpixel disposed on the display panel 110 in the display apparatus 100 according to aspects of the present disclosure may include a first subpixel SPw with a first emission angle and a second subpixel SPn with a second emission angle.

The first emission angle emitted through the first subpixel SPw may be greater than the second emission angle emitted through the second subpixel SPn.

The first subpixel SPw may include a first anode electrode AE1, a first emission layer EL1, and a first cathode electrode CE1. The first anode electrode AE1, the first emission layer EL1, and the first cathode electrode CE1 may constitute a first light emitting element.

Further, a first black matrix BM1, a first insulating layer ENCAP1, a first gap filler GF1, and a first lens Lz1 with a first emission angle may be disposed on the first cathode electrode CE1. An auxiliary gap filler may be further disposed on the first lens Lz1.

Here, a portion of the area of the first black matrix BM1 overlapping with the first anode electrode AE1 may be open.

The second subpixel SPn may include a second anode electrode AE2, a second emission layer EL2, and a second cathode electrode CE2. The second anode electrode AE2, the second emission layer EL2, and the second cathode electrode CE2 may constitute a second light emitting element.

Further, a second black matrix BM2, a second insulating layer ENCAP2, a second gap filler GF2, and a second lens Lz2 with a second emission angle may be disposed on the second cathode electrode CE2. An auxiliary gap filler may be further disposed on the second lens Lz2.

A portion of the area of the second black matrix BM2 overlapping with the second anode electrode AE2 may be open.

The first black matrix BM1 and the second black matrix BM2 may prevent light from being incident to an active layer of a driving transistor constituting a subpixel to prevent leakage current from being generated.

The first anode electrode AE1 of the first subpixel SPw and the second anode electrode AE2 of the second subpixel SPn may be formed in a same process, on a same layer, with a same material, and with the same thickness, but aspects of the present disclosure are not limited thereto. The first anode electrode AE1 and the second anode electrode AE2 may be formed through a mask process using photoresist, but aspects of the present disclosure are not limited thereto.

The first emission layer EL1 of the first subpixel SPw and the second emission layer EL2 of the second subpixel SPn may be formed with a same material, same color, and same thickness on a same layer through a same process, but aspects of the present disclosure are not limited thereto.

Each of the first emission layer EL1 and the second emission layer EL2 may include a hole injecting layer (HIL), a hole transporting layer (HTL), an electron blocking layer (EBL), an emitting material layer (EML), an electron transporting layer (ETL), a hole blocking layer HBL, and an electron injecting layer (EIL), but aspects of the present disclosure are not limited thereto.

The first cathode electrode CE1 of the first subpixel SPw and the second cathode electrode CE2 of the second subpixel SPn may be formed with a same material, same color, and same thickness on the same layer through a same process, but aspects of the present disclosure are not limited thereto.

The first cathode electrode CE1 and the second cathode electrode CE2 may be formed of an opaque metal material, such as at least one of aluminum (A1), tungsten (W), copper (Cu), molybdenum (Mo), chromium. (Cr), tantalum (Ta), titanium (Ti), and alloys formed from combinations thereof, but aspects of the present disclosure are not limited thereto.

The first gap filler GF1 of the first subpixel SPw and the second gap filler GF2 of the second subpixel SPn may be formed with the same material, same color, and same thickness on the same layer through a same process, but aspects of the present disclosure are not limited thereto.

A space (or a distance) between the first emission layer EL1 and the first lens Lz1 may be adjusted based on the thickness (height) of the first gap filler GF1. Further, a space (or a distance) between the second emission layer EL2 and the second lens Lz2 may be adjusted based on the thickness (height) of the second gap filler GF2.

The first gap filler GF1 or the second gap filler GF2 may be formed of one of acrylic, epoxy, and silicon or combinations thereof. Further, the first gap filler GF1 or the second gap filler GF2 may be formed of an organic material, but aspects of the present disclosure are not limited thereto.

A particle size in the first gap filler GF1 or the second gap filler GF2 may be equal to a wavelength of light, or may be larger or smaller than the wavelength of light by a certain range. The first gap filler GF1 or the second gap filler GF2 may have forward diffusion property based on one of a particle density, a particle size, and a particle shape.

The first gap filler GF1 or the second gap filler GF2 may have a smaller refractive index than that of the first insulating layer ENCAP1. For example, the first gap filler GF1 and the second gap filler GF2 may have a smaller refractive index than that of the first insulating layer ENCAP1 due to one of the particle density, size, and shape.

A material of the first insulating layer ENCAP1 or the second insulating layer ENCAP2 may be one of $TiO_2$, $Al_2O_3$, and $SiO_2$, but aspects of the present disclosure are not limited thereto.

When the material of the first insulating layer ENCAP1 or the second insulating layer ENCAP2 is $TiO_2$, the first insulating layer ENCAP1 or the second insulating layer ENCAP2 may have a refractive index in a range of 2.6 to 2.9. When the material of the first insulating layer ENCAP1 or the second insulating layer ENCAP2 is $Al_2O_3$, the first insulating layer ENCAP1 or the second insulating layer ENCAP2 may have a refractive index in a range of 1.75 to 1.76. When the material of the first insulating layer ENCAP1 or the second insulating layer ENCAP2 is $SiO_2$, the first insulating layer ENCAP1 or the second insulating layer ENCAP2 may have a refractive index in a range of 1.40 to 1.55.

The first lens Lz1 disposed in the first subpixel SPw with a wide emission angle may be a cylinder-type lens, but aspects of the present disclosure are not limited thereto. The second lens Lz2 disposed in the second subpixel SPn with a narrow emission angle may be a circular type lens, but aspects of the present disclosure are not limited thereto.

The first lens Lz1 of the first subpixel SPw and the second lens Lz2 of the second subpixel SPn may be formed with the same material, same color, and same thickness on the same layer through a same process, but aspects of the present disclosure are not limited thereto. For example, the first lens Lz1 and the second lens Lz2 may be formed to have different shapes and different sizes.

The refractive index of the first lens Lz1 and the second lens Lz2 may be determined depending on the shape of the lens and the thickness (height) of the first gap filler GF1 and the second gap filler GF2.

Figure 5:
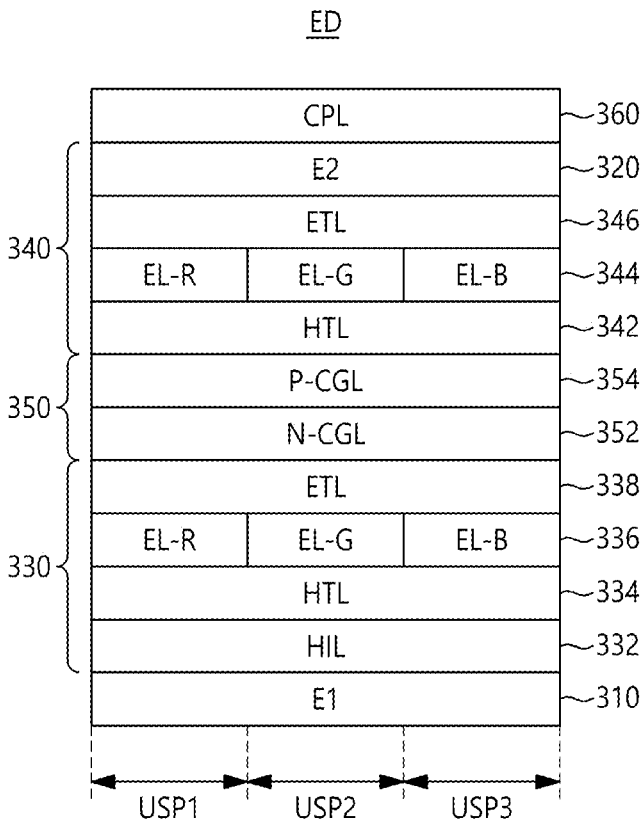
FIG. 5 illustrates a light emitting element according to aspects of the present disclosure.

FIG. 5 illustrates a light emitting element according to aspects of the present disclosure.

Referring to FIG. 5, the light emitting element ED of the subpixel in the display apparatus 100 according to aspects of the present disclosure may include a first electrode 310 and a second electrode 320. Further, the light emitting element ED may include a first emission part 330, a second emission part 340 and a charge generation layer 350 between the first electrode 310 and the second electrode 320.

The first electrode 310 as an anode electrode may include a conductive material with a high work function, but aspects of the present disclosure are not limited thereto. The second electrode 320 as a cathode electrode may include a conductive material with a low work function, but aspects of the present disclosure are not limited thereto.

The first emission part 330 may include a hole injecting layer 332, a first hole transporting layer 334, a first emission layer 336, and a first electron transporting layer 338, but aspects of the present disclosure are not limited thereto.

The hole injecting layer 332 may be disposed between the first electrode 310 and the first emission layer 336. For example, the hole injecting layer 332 may include at least one of MTDATA (4,4',4''-tris(N-3-methylphenyl-N-phenylamino)triphenylamine), CuPc (copper phthalocyanine), and TCTA (tris(4-carbazoyl-9-ylphenyl)amine), NPB(N,N'-di(naphthalen-1-yl)-N,N'-diphenyl-benzidine), NPD (N,N-dinaphthyl-N,N'-diphenyl benzidine), HATCN (1,4,5,8,9, 11-hexaazatriphenylene-hexanitrile), TDAPB (1,3,5-tris(4-diphenylaminophenyl)benzene), PEDOT/PSS(Poly(3,4-ethylene dioxythiophene)/Polystyrene sulfonate), F4TCNQ (2,3,5,6-tetrafluoro-7,7,8,8-tetracyanl-quinidimethane), N-(biphenyl-4-yl)-9,9-dimethyl-N-4-(9-phenyl-9H-carbazol-3-yl)phenyl)-9H-fluoren-2-amine, but aspects of the present disclosure are not limited thereto.

The first hole transporting layer 334 may be disposed between the hole injecting layer 332 and the first emission layer 336. The first emission layer 336 may be disposed between the first hole transporting layer 334 and the first electron transporting layer 338. Further, the first electron transporting layer 338 may be disposed between the first emission layer 336 and a charge generation layer 350.

The second emission part 340 may include a second hole transport layer 342, a second emission layer 344, and a second electron transport layer 346, but aspects of the present disclosure are not limited thereto.

The second emission layer 344 may be disposed between the second hole transporting layer 342 and the second electron transporting layer 346. The second electron transporting layer 346 may be disposed between the second emission layer 344 and the second electrode 320.

The electron injecting layer may be further disposed between the second electron transporting layer 346 and the second electrode 320. The electron injecting layer may include an alkali halide compound, e.g., LiF, CsF, NaF or BaF$_2$, or lithium quinolate (Liq), lithium benzoate or sodium stearate, e.g., but is not limited thereto.

Each of the first emission layer 336 and the second emission layer 344 may be formed by doping a host with a dopant, and may emit a same color or different colors.

For example, the first emission layer 336 and the second emission layer 344 may include a red emission layer EL-R, a green emission layer EL-G, and a blue emission layer EL-B, respectively. The red emission layer EL-R may form a first subpixel area USP1 that emits red color. The green emission layer EL-G may form a second subpixel area USP2 that emits green color. The blue emission layer EL-B may form a third subpixel area USP3 that emits blue color.

The first hole transporting layer 334 and the second hole transporting layer 342 may be formed of the same material or may be formed of different materials.

The first electron transporting layer 338 and the second electron transporting layer 346 may be formed of oxadiazole, triazole, phenanthroline, benzoxazole, benzthiazole or benzimidazole (e.g., 2-[4-(9,10-Di-2-naphthalenyl-2-anthracenyl)phenyl]-1-phenyl-1H-benzimidazole), but aspects of the present disclosure are not limited thereto.

Each of the first electron transporting layer 338 and the second electron transporting layer 346 may include a dopant such as an alkali metal or an alkaline earth metal, but aspects of the present disclosure are not limited thereto. The first electron transporting layer 338 and the second electron transporting layer 346 may be formed of a same material or may be formed of different materials.

A charge generation layer (CGL) 350 may be disposed between the first emission part 330 and the second emission part 340. The charge generation layer 350 may be disposed between the emission parts to supply positive and negative charges to each emission part, respectively.

The charge generation layer 350 may include an N-type charge generation layer (N-CGL) 352 adjacent to the first emission part 330 and a P-type charge generation layer (P-CGL) 354 adjacent to the second emission part 340. The N-type charge generation layer 352 may supply electrons to the first emission part 330, and the P-type charge generation layer 354 may supply holes to the second emission part 340.

The N-type charge generation layer 352 may be an organic layer doped with an alkali metal such as Li, Na, K, Cs, and/or an alkaline earth metal such as Mg, Sr, Ba, and Ra, but aspects of the present disclosure are not limited thereto.

The second hole injecting layer may be further disposed between the P-type charge generation layer 354 and the second hole transporting layer 342 or between the N-type charge generation layer 352 and the P-type charge generation layer 354. When forming the second hole injecting layer, holes generated in the P-type charge generation layer 354 may be efficiently injected and transferred to the second emission part 340.

The first hole injecting layer 332 and the second hole injecting layer may be formed of a same material or may be formed of different materials.

A capping layer 360 may be formed on the second electrode 320 to increase the light extraction effect of the light emitting element ED. The capping layer 360 may be formed of any one of the materials constituting the first and second hole transporting layers 334, 342, or the materials constituting the first and second electron transporting layers 338, 346, but aspects according to the present disclosure are not limited thereto. As another example, the capping layer 360 may be formed of any one of the host materials of the first emission part 336 and the second emission part 344, but aspects of the present disclosure are not limited thereto. In another example, the capping layer 360 may be omitted.

A light emitting element ED with a tandem structure may lower the driving voltage and emit white color. Therefore, the display apparatus 100 may be driven at a low voltage, improve a life span of the light emitting element ED, and improve an emission efficiency.

Figure 6:
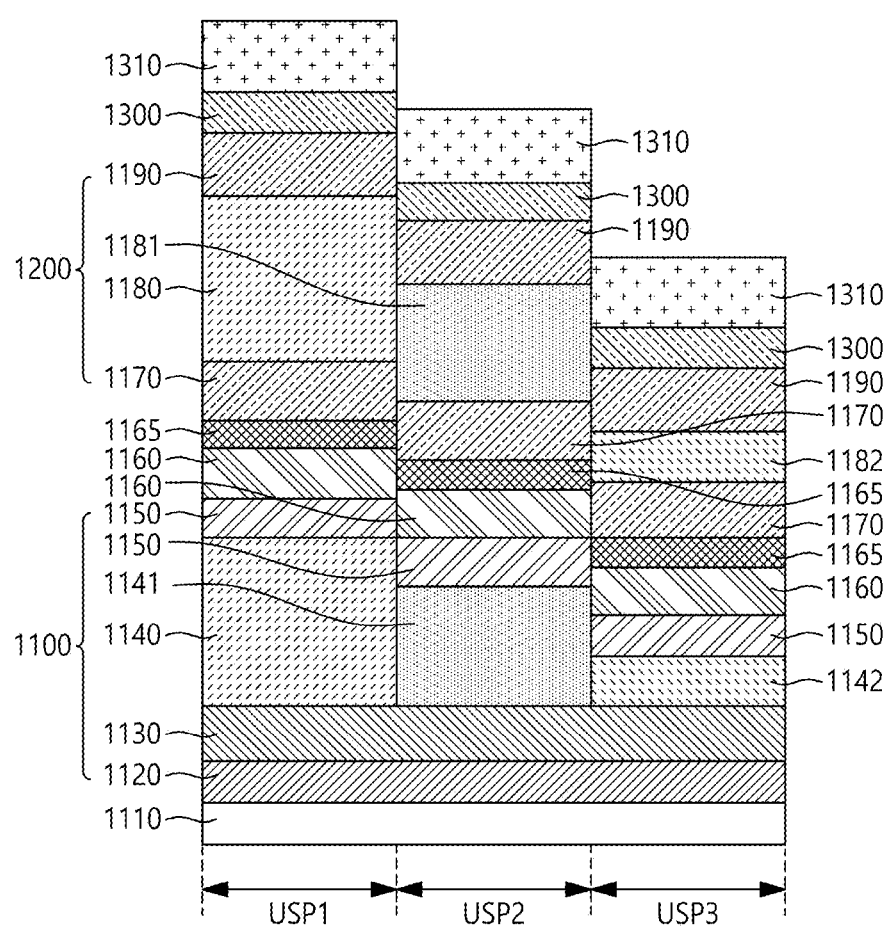
FIG. 6 illustrates another example of a light emitting element in a display apparatus according to aspects of the present disclosure.

FIG. 6 illustrates another example of a light emitting element in a display apparatus according to aspects of the present disclosure.

Referring to FIG. 6, the light emitting element ED of the display apparatus 100 according to aspects of the present disclosure may include emission parts 1100, 1200 between the first electrode 1110 and the second electrode 1300. The description included in FIG. 6 may be included in the description included in FIG. 5

The first electrode 1110 may include an indium-tin-oxide (ITO), and a silver alloy (Ag alloy), but are not limited thereto. For example, ITO may be formed to a thickness of 70 Å, a silver alloy (Ag alloy) may be formed on an upper portion of the ITO to a thickness of 1000 Å, and then ITO may be formed on top of the silver alloy to a thickness of 70 Å, but aspects of the present disclosure are not limited thereto.

The first emission part 1100 may be disposed on the first electrode 1110. The first emission part 1100 may include a hole injecting layer 1120, a first hole transporting layer 1130, an emission layer, and a first electron transporting layer 1150, but aspects of the present disclosure are not limited thereto.

The hole injecting layer 1120 may be formed on the first electrode 1110. The hole injection layer 1120 may be formed of HATCN (1,4,5,8,9,11-hexaazatriphenylene-hexanitrile), etc., but aspects of the present disclosure are not limited thereto. For example, the hole injecting layer 1120 may be formed to a thickness of 70 Å, but aspects of the present disclosure are not limited thereto. The first hole transporting layer 1130 may be formed on the hole injection layer 1120. The first hole transporting layer 1130 may be formed of NPD (N,N-dinaphthyl-N,N'-diphenylbenzidine), etc., but aspects of the present disclosure are not limited thereto. For example, the first hole transporting layer 1130 may be formed to a thickness of 500 Å, but aspects of the present disclosure are not limited thereto.

The 1-1 emission layer 1140 may be disposed in the red subpixel area USP1 on the first hole transporting layer 1130. The 1-1 emission layer 1140 may include at least one host and at least one dopant. For example, the host material may be composed of a beryllium compound (Be complex) derivative, etc., but aspects of the present disclosure are not limited thereto. For example, after forming the host material to a thickness of 650 Å, the 1-1 emission layer 1140 may be formed by doping with a dopant at a level of 5%, but the aspects of the present disclosure are not limited thereto.

The 1-2 emission layer 1141 may be disposed in the green subpixel area USP2 on the first hole transporting layer 1130. The 1-2 emission layer 1141 may include at least one host and at least one dopant. For example, the host material may be composed of CBP (carbazole biphenyl), etc., but aspects of the present disclosure are not limited thereto. For example, after forming the host material to a thickness of 400 Å, the 1-2 emission layer 1141 may be formed by doping with a dopant at a level of 5%, but the aspects of the present disclosure are not limited thereto.

The 1-3 emission layer 1142 may be disposed in the blue subpixel area USP3 on the first hole transporting layer 1130. The 1-3 emission layer 1142 may include at least one host and at least one dopant. For example, the host material may be composed of an anthracene derivative, etc., but aspects of the present disclosure are not limited thereto. For example, after forming the host material to a thickness of 200 Å, the 1-3 emission layer 1142 may be formed by doping with a dopant at a level of 5%, but aspects of the present disclosure are not limited thereto.

For example, the thickness of the 1-1 emission layer 1140 may be thicker than the thickness of the 1-2 emission layer 1141. For example, the thickness of the 1-1 emission layer 1140 may be thicker than the thickness of the 1-3 emission layer 1142. For example, the thickness of the 1-2 emission layer 1141 may be thicker than the thickness of the 1-3 emission layer 1142. For example, the thickness of the 1-1 emission layer 1140 may be thicker than the thickness of each of the 1-2 emission layer 1141 and the 1-3 emission layer 1142.

The first electron transporting layer 1150 may be disposed on the 1-1 emission layer 1140, the 1-2 emission layer 1141, and the 1-3 emission layer 1142. For example, the first electron transporting layer 1150 may include an anthracene derivative and lithium quinolate (Liq), but aspects of the present disclosure are not limited thereto. For example, an anthracene derivative and Liq (lithium quinolate) may be mixed in a ratio of 1:1, but aspects of the present disclosure are not limited thereto. The first electron transporting layer 1150 may be formed to a thickness of 70 Å, but aspects of the present disclosure are not limited thereto.

For another example, a hole blocking layer may be further formed under the first electron transporting layer 1150. The hole blocking layer may be formed on the 1-1 emission layer 1140, the 1-2 emission layer 1141, and the 1-3 emission layer 1142.

An N-type charge generation layer (N-CGL) 1160 may be formed on the first electron transporting layer 1150, and a P-type charge generation layer (P-CGL) 1165 may be formed on the N-type charge generation layer 1160. The N-type charge generation layer 1160 may be formed of $Alq_3$, etc., but aspects of the present disclosure are not limited thereto. For example, the N-type charge generation layer 1160 may be formed to a thickness of 100 Å and then doped with lithium (Li), but aspects of the present disclosure are not limited thereto. The P-type charge generation layer 1165 may be formed on the N-type charge generation layer 1160 by HATCN, etc., but aspects of the present disclosure are not limited thereto. The P-type charge generation layer 1165 may be formed to a thickness of 100 Å to form a charge generation layer with a thickness of 200 Å, but aspects of the present disclosure are not limited thereto.

The second emission part 1200 may be disposed on the charge generation layer. The second emission part 1200 may include a second hole transporting layer 1170, an emission layer, and a second electron transporting layer 1190, but aspects of the present disclosure are not limited thereto. For example, the charge generation layer may be disposed between the first emission part 1100 and the second emission part 1200.

A second hole transporting layer 1170 may be formed on the charge generation layer. The second hole transport layer 1170 may be formed of NPD or the like, but aspects of the present disclosure are not limited thereto. The second hole transporting layer 1170 may be formed to a thickness of 400 Å, but aspects of the present disclosure are not limited thereto. For example, the thickness of the second hole transporting layer 1170 may be greater than or equal to the thickness of the first hole transporting layer 1130, but aspects of the present disclosure are not limited thereto.

The 2-1 emission layer 1180 may be formed in the red subpixel area USP1 on the second hole transporting layer 1170. The 2-1 emission layer 1180 may include at least one host and at least one dopant. The 2-1 emission layer 1180 may be composed of a host material, such as a beryllium compound (Be complex) derivative, but aspects of the present disclosure are not limited thereto. The host material may be formed to a thickness of 650 Å and then doped with a dopant at a level of 5% to form the 2-1 emission layer 1180, but aspects of the present disclosure are not limited thereto.

For another example, a hole transporting layer may be further disposed under the 2-1 emission layer 1180. The hole transporting layer may further improve an emission efficiency of the 2-1 t emission layer 1180. The hole transport layer may be disposed between the second hole transporting layer 1170 and the 2-1 emission layer 1180. For example, the hole transporting layer may be formed of a same material as the second hole transporting layer 1170, but aspects of the present disclosure are not limited thereto. For example, the thickness of the hole transporting layer may be thicker than the thickness of the second hole transporting layer 1170, but aspects of the present disclosure are not limited thereto.

The 2-2 emission layer 1181 may be formed in the green subpixel area USP2 on the second hole transporting layer 1170. The 2-2 emission layer 1181 may include at least one host and at least one dopant. The 2-2 emission layer 1181 may be composed of a host material such as CBP, but aspects of the present disclosure are not limited thereto. The host material may be formed to a thickness of 400 Å and then doped with a dopant at a level of 5% to form the 2-2 emission layer 1181, but aspects of the present disclosure are not limited thereto.

The 2-3 emission layer 1182 may be formed in the blue subpixel area USP3 on the second hole transporting layer 1170. The 2-3 emission layer 1182 may include at least one host and at least one dopant. The 2-3 emission layer 1182 may include an anthracene derivative as a host material, but aspects of the present disclosure are not limited thereto. The host material may be formed to a thickness of 200 Å and then doped with a dopant at a level of 5% to form the 2-3 emission layer 1182, but aspects of the present disclosure are not limited thereto.

For example, the thickness of the 2-1 emission layer 1180 may be thicker than the thickness of the 2-2 emission layer 1181. For example, the thickness of the 2-1 emission layer 1180 may be thicker than the thickness of the 2-3 emission layer 1182. For example, the thickness of the 2-2 emission layer 1181 may be thicker than the thickness of the 2-3 emission layer 1182. For example, the thickness of the 2-1 emission layer 1180 may be thicker than each of the 2-2 emission layer 1181 and the 2-3 emission layer 1182.

For example, the thickness of the 1-1 emission layer 1140 may be the same as or different from the thickness of the 2-1 emission layer 1180. For example, the thickness of the 1-2 emission layer 1141 may be the same as or different from the thickness of the 2-2 emission layer 1181. For example, the thickness of the 1-3 emission layer 1142 may be the same as or different from the thickness of the 2-3 emission layer 1182.

A second electron transporting layer 1190 may be formed on the 2-1 emission layer 1180, the 2-2 emission layer 1181, and the 2-3 emission layer 1182. The second electron transporting layer 1190 may be composed of an anthracene derivative, lithium quinolate (Liq), etc., but aspects of the present disclosure are not limited thereto. For example, an anthracene derivative and Liq (lithium quinolate) may be mixed at a ratio of 1:1 to form a thickness of 300 Å, but aspects of the present disclosure are not limited thereto. For example, the thickness of the second electron transporting layer 1190 may be greater than or equal to the thickness of the first electron transporting layer 1150, but aspects of the present disclosure are not limited thereto.

For example, the emission layer of the first emission part 1100 may emit the same color as the emission layer of the second emission part 1200. For example, the 1-1 emission layer 1140 of the first emission part 1100 may emit the same color as the 2-1 emission layer 1180 of the second emission part 1200. For example, the 1-2 emission layer 1141 of the first emission part 1100 may emit the same color as the 2-2 emission layer 1181 of the second emission part 1200. For example, the 1-3 emission layer 1142 of the first emission part 1100 may emit the same color as the 2-3 emission layer 1182 of the second emission part 1200.

For another example, a hole blocking layer may be further formed under the second electron transporting layer 1190. The hole blocking layer may be formed on the 2-1 emission layer 1180, the 2-2 emission layer 1181, and the 2-3 emission layer 1182.

The second electrode 1300 may be formed on the second electron transporting layer 1190. For example, the second electrode 1300 may be formed of magnesium (Mg), silver (Ag), etc., but aspects of the present disclosure are not limited thereto. For example, a magnesium-silver alloy (Mg:Ag) obtained by mixing magnesium (Mg) and silver (Ag) at a ratio of 9:1 may be formed to a thickness of 140 Å, but aspects of the present disclosure are not limited thereto. The second electrode 1300 may be a semi-transmissive electrode.

A capping layer 1310 may be formed on the second electrode 1300. The capping layer 1310 may be composed of one or more layers, but aspects of the present disclosure are not limited thereto. The capping layer 1310 may minimize damage to the second electrode 1300 of the light emitting element ED and the organic material layers below the second electrode 1300 from an external light source. The capping layer 1310 may be formed of an organic or inorganic film. The capping layer 1310 may be an inorganic layer formed of a material such as LiF, and may further include an organic layer, but aspects of the present disclosure are not limited thereto. For example, the capping layer 1310 may be composed of a stacked structure of an organic film and an inorganic film, and the thickness of the organic film may be different from the thickness of the inorganic film. For example, the thickness of the organic film may be greater than the thickness of the inorganic film. As another example, the capping layer 1310 may be composed of two or more layers by stacking materials with different refractive indices. Thus, the emission efficiency of the display apparatus 100 may be improved.

Considering the step between subpixels of the light emitting element ED based on the first electrode 1110, the gap between the 1-1 emission layer 1140 and the 1-2 emission layer 1141 may be formed at a level of 250 Å, the step between the 1-2 emission layer 1141 and the 1-3 emission layer 1142 may be formed at a level of 200 Å. Further, the step between the 1-3 emission layer 1142 and the 1-1 emission layer 1140 may be formed at a level of 250 Å.

In the light emitting element ED of the present disclosure, since the step between the 1-1 emission layer 1140 and the 1-2 emission layer 1141, the step between the 1-2 emission layer 1141 and the 1-3 emission layer 1142, and the gap between the 1-3 emission layer 1142 and the 1-1 emission layer 1140 is formed, the charge generation layers 1160 may have steps with each other in the red, green, and blue subpixel areas of the upper part of the emission layer. For example, in the light emitting element ED of the present disclosure, since the step between the 1-1 emission layer 1140 and the 1-2 emission layer 1141, the step between the 1-2 emission layer 1141 and the 1-3 emission layer 1142 and the step between the 1-3 light emitting layer 1142 and the 1-1 light emitting layer 1140 are all formed at a level of 200 Å or more, the charge generation layers 1160 formed in the red, green, and blue subpixel areas on the emission layer also have a step of 200 Å or more.

Accordingly, the charge generation layer 1160 in the red subpixel area USP1, the charge generation layer 1160 in the green subpixel area USP2, and the charge generation layer 1160 in the blue subpixel area USP3 may not be substantially connected to each other. The meaning that the charge generation layers 1160 are not substantially connected between two subpixel areas may mean that the charge generation layers 1160 formed in each subpixel area are separated by the step or horizontal current hardly flows even if the charge generation layers 1160 formed in each subpixel area are not separated by the step. Accordingly, the charge generation layers 1160 may be substantially insulated with each other by the step.

The light emitting element ED constituting the display apparatus 100 of the present disclosure does not generate horizontal current due to the high conductivity of the charge generation layer 1160. Therefore, a light leakage phenomenon in which unwanted adjacent subpixels emit light together may be reduced.

Figure 7:
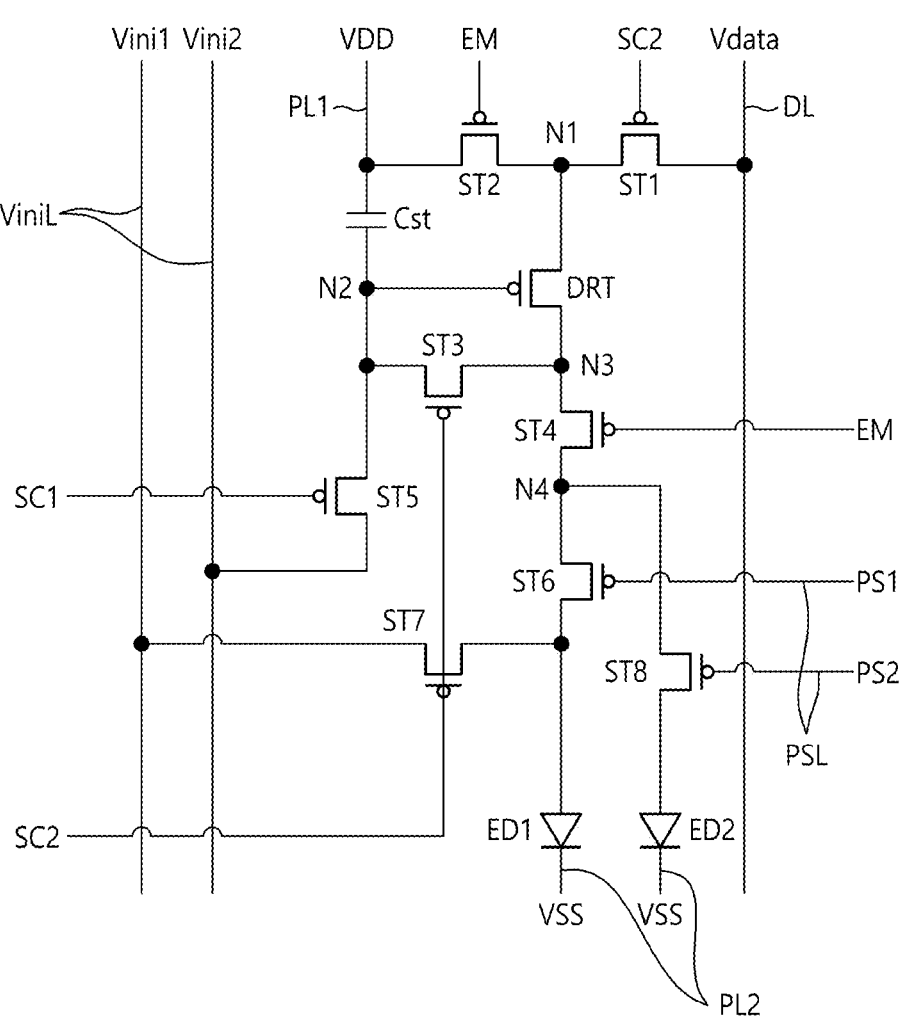
FIG. 7 illustrates a circuit diagram of a unit subpixel according to aspects of the present disclosure.

FIG. 7 illustrates a circuit diagram of a unit subpixel according to aspects of the present disclosure.

Referring to FIG. 7, a unit subpixel in the display device 100 according to aspects of the disclosure may include a first light emitting element ED1, a second light emitting element ED2, a driving transistor DRT, and an internal compensation circuit.

The first light emitting element ED1 may be disposed in the first subpixel SPw, and the second light emitting element ED2 may be disposed in the second subpixel SPn.

The first lens Lz1 may be disposed on the first light emitting element ED1, and the second lens Lz2 may be disposed on the second light emitting element ED2.

The switching transistors ST1-ST8, DRT disposed in unit subpixel may be implemented as PMOS type LTPS (Low Temperature Poly Silicon) transistors, and a desired response characteristics may be obtained from these, but aspects of the present disclosure are not limited thereto.

For example, at least one transistor among the switching transistors ST1-ST8 may be implemented as an NMOS type or PMOS type oxide transistor with good characteristics for leakage current when turned off, and the remaining transistors may be implemented as a PMOS type LTPS transistor with good response characteristics, but aspects of the present disclosure are not limited thereto.

The unit subpixel may include a first switching transistor ST1 which is connected to the data line and transmits the data voltage Vdata by the second scan signal SC2.

The unit subpixel may include a second switching transistor ST2 which is connected to a first pixel voltage line PL1 supplying a pixel driving voltage VDD and transmits the pixel driving voltage VDD by the emission signal EM.

The driving transistor DRT may connect the first node N1 to the third node N3. The driving transistor DRT may receive the voltage charged in the storage capacitor Cst as a gate voltage through the second node N2. The first node N1 may be shared by the first switching transistor ST1 and the second switching transistor ST2.

A fourth switching transistor ST4 may be connected between the third node N3 and the first light emitting element ED1. The fourth switching transistor ST4 may be controlled by the emission signal EM. A sixth switching transistor ST6 may be connected between the third node N3 and the first light emitting element ED1. The sixth switching transistor ST6 may be controlled by the first mode control signal PS1.

The fourth switching transistor ST4 may be connected between the third node N3 and the second light emitting element ED2. The fourth switching transistor ST4 may be controlled by the emission signal EM. An eighth switching transistor ST8 may be connected to the fourth node N4. The eighth switching transistor ST8 may be controlled by the second mode control signal PS2.

Accordingly, the first light emitting element ED1 or the second light emitting element ED2 may emit light by the first mode control signal PS1 and the second mode control signal PS2 in a state in which the fourth transistor T4 is turned on by the emission signal EM.

The third switching transistor ST3 may connect the second node N2 to the third node N3. The third switching transistor ST3 may be controlled by the second scan signal SC2.

The fifth switching transistor ST5 may be connected between the second node N2 and the initialization voltage line ViniL. The initialization voltage line ViniL may supply a second initialization voltage Vini2. The fifth switching transistor ST5 may be controlled by the first scan signal SC1. Accordingly, the fifth switching transistor ST5 may initialize the gate node of the driving transistor DRT to the second initialization voltage Vini2 by the first scan signal SC1.

The seventh switching transistor ST7 may be connected between an anode electrode of the first light emitting element ED1 and the initialization voltage line ViniL. The initialization voltage line ViniL may supply a first initialization voltage Vini1. The seventh switching transistor ST7 may be controlled by the second scan signal SC2. Accordingly, the seventh switching transistor ST7 may initialize the anode electrode of the first light emitting element ED1 to the first initialization voltage Vini1 by the second scan signal SC2.

The first light emitting element ED1 and the second light emitting element ED2 may emit light with an amount of current controlled by the voltage Vgs between the gate node and source node of the driving transistor DRT.

The first light emitting element ED1 may be connected to the driving transistor DRT through the fourth switching transistor ST4 and the sixth switching transistor ST6. The second light emitting element ED2 may be connected to the driving transistor DRT through the fourth switching transistor ST4 and the eighth switching transistor ST8.

The cathode electrodes of the first light emitting element ED1 and the second light emitting element ED2 may be connected to a second pixel voltage line PL2 supplying the low-potential pixel driving voltage VSS.

The driving transistor DRT may control a driving current flowing through the first light emitting element ED1 or the second light emitting element ED2 according to the voltage Vgs between the gate node and the source node.

The compensation circuit may sample the voltage Vgs between the gate node and the source node of the driving transistor DRT to compensate for the change in threshold voltage of the driving transistor DRT. The compensation circuit may include first to eighth switching transistors ST1-ST8 and a storage capacitor Cst. Alternatively, the remainder excluding the first switching transistor ST1 for supplying the data voltage Vdata may be referred to as the compensation circuit.

Accordingly, the unit subpixel constituting the display device 100 of the present disclosure may control the first light emitting element ED1 by the first mode control signal PS1 and may control the second light emitting element ED2 by the second mode control signal PS2.

For example, the first mode control signal PS1 may supplied at a turn-on level (e.g., low level), and the second mode control signal PS2 may be supplied at a turn-off level (e.g., high level) in a period when the first light emitting element ED1 emits light.

The gate driving circuit 120 may be implemented in the form of a gate in panel (GIP) formed directly in the non-display area NDA of the display panel 110, or may be implemented in the form of a gate in array formed in the display area DA of the display panel 110.

When the display apparatus 100 is located in a vehicle, the internal temperature of the vehicle may change at a rapid rate due to the external light and internal air conditioning flow of the vehicle, and the distribution of the internal temperature of the display panel 110 may also change in various ways.

Therefore, it is difficult to accurately measure the temperature of the display panel 110 through a temperature sensor located inside the vehicle or a temperature sensor located on the substrate of the display device 100.

The display apparatus 100 of the present disclosure may include sensing subpixels in a non-display area of the display panel 110 to detect driving temperatures according to the positions of the display panel 110 through the sensing subpixels. It will be explained below.

Figure 8:
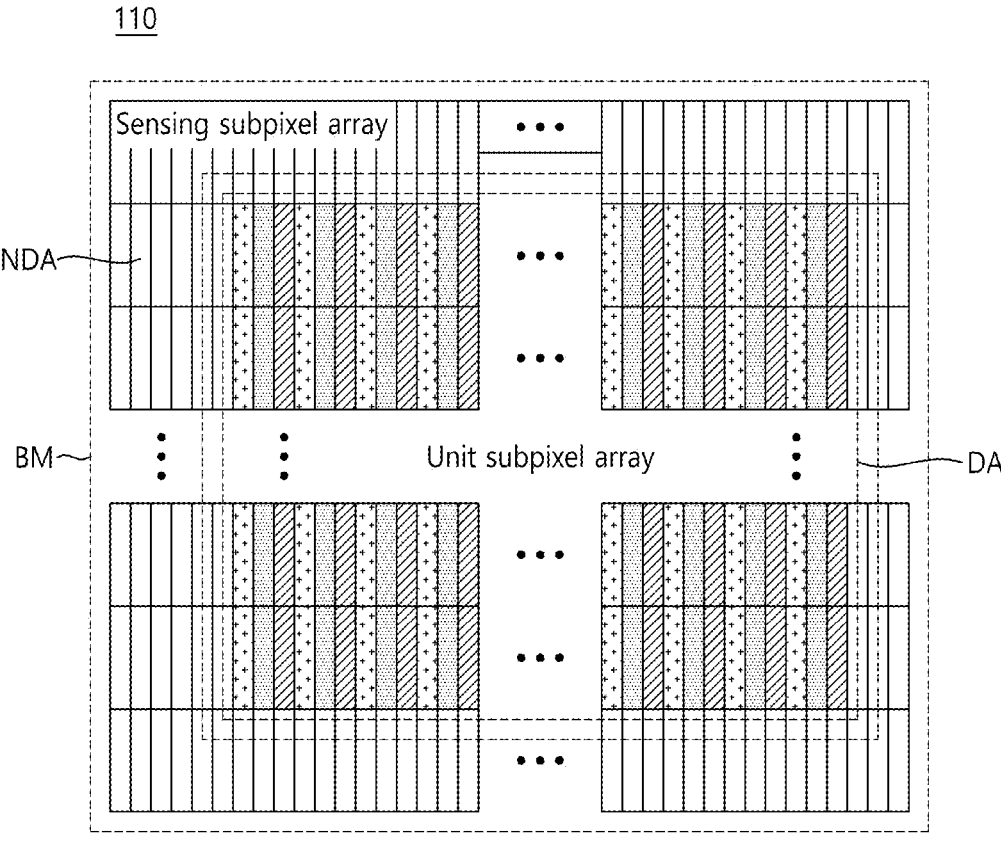
FIG. 8 illustrates a structure of a unit subpixel array and a sensing subpixel array according to aspects of the present disclosure.

FIG. 8 illustrates a structure of a unit subpixel array and a sensing subpixel array according to aspects of the present disclosure.

The display panel 110 in the vehicle may quickly change to various temperatures due to external light and/or internal air conditioning flow of the vehicle, and the internal temperature distribution of the display panel 110 may also change in various ways. Since the temperature sensor is disposed inside the vehicle, there is a problem in that an error occurs between the temperature of the temperature sensor and a temperature of the display panel 110. Since the temperature sensor detects the temperature of the external environment, there is a problem in that it cannot accurately measure an internal temperature of the display panel 110. Temperature sensors have the problem of detecting only one temperature value. For example, the display panel 110 may be the second display panel 112, but aspects of the present disclosure are not limited thereto.

Referring to FIG. 8, the display apparatus 100 according to aspects of the present disclosure may include a sensing subpixel array configured to detect a driving temperature of the display panel 110. The sensing subpixel array may be disposed outside the unit subpixel array corresponding to the display area DA of the display panel 110, for example, in the non-display area NDA. The shape, number, and arrangement structure of the sensing subpixel array formed in the non-display area NDA of the display panel 110 may be formed differently depending on the location in the vehicle.

The substrate constituting the display panel 110 may include a display area DA where unit subpixels emitting light to the outside are formed, and a non-display area NDA which is located outside the display area DA and includes a subpixel array.

The non-display area NDA may include an upper non-display area located above (or an upper portion) the display area DA, a lower non-display area located below (or a lower portion) the display area DA, a right non-display area located on a right side (or a right portion) of the display area DA, and a left non-display area located on a left side (or a left portion) of the display area DA.

One or more upper sensing subpixel arrays may be formed in an upper portion of the non-display area, and one or more lower sensing subpixel arrays may be formed in a lower portion of the non-display area. One or more right sensing subpixel arrays may be formed in the right portion of the non-display area, and one or more left sensing subpixel arrays may be formed in the left portion of the non-display area. At least one of the upper sensing subpixel array, the lower sensing subpixel array, the right sensing subpixel array, and the left sensing subpixel array may be omitted.

The sensing subpixel array may share the data line DL with the unit subpixel array disposed at the display area DA. For example, the vertically arranged sensing subpixel array and the unit subpixel array in the display area DA may be connected to the same data line DL. Therefore, the sensing subpixel array may provide a response characteristic similar to the unit subpixel array disposed at the display area DA.

Further, the unit subpixel array in the display area DA and the sensing subpixel array in the non-display area NDA may be driven by a same driving signal. For example, the unit subpixel array may share the gate driving circuit 120 and the data driving circuit 130 with the sensing subpixel array.

The sensing subpixel array in the non-display area NDA may emit light to the outside during a process of detecting the driving temperature. Therefore, a black matrix BM may be formed in the upper part to block the light emitted to the outside during the process of detecting the driving temperature.

According to aspects of the present disclosure, the driving temperature of the display panel 110, rather than the environmental temperature, may be accurately detected by the sensing subpixel array. This allows accurate compensation reflecting an exact operating temperature.

Figure 9:
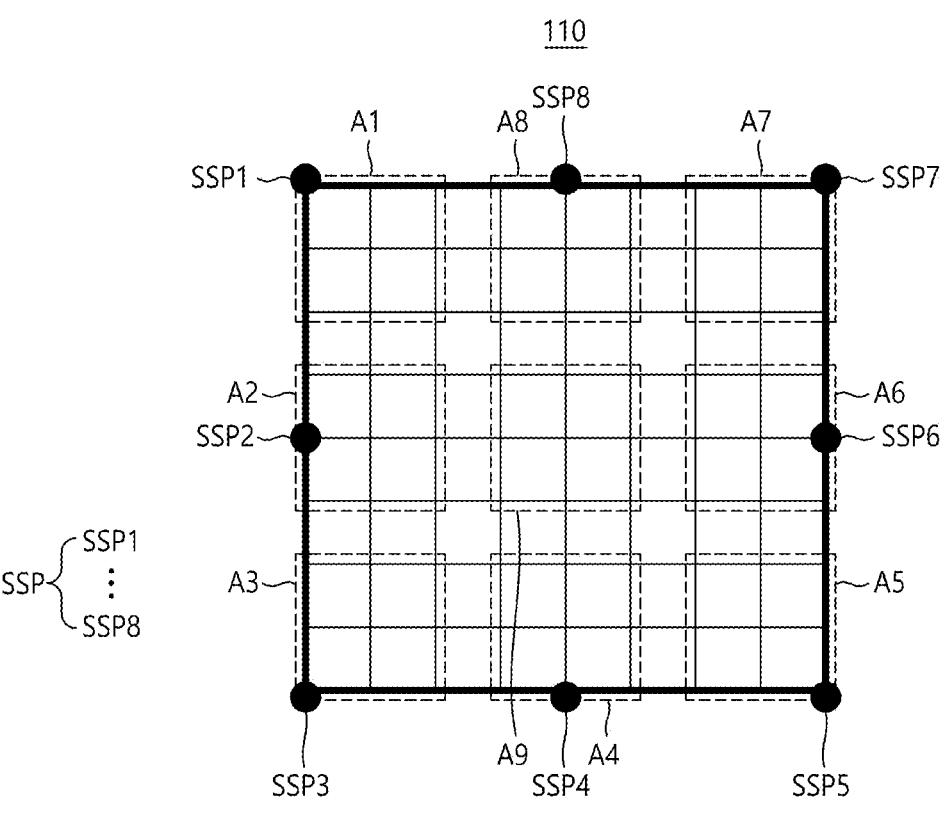
FIG. 9 illustrates temperature detection areas according to locations of sensing subpixels according to aspects of the present disclosure.

FIG. 9 illustrates temperature detection areas according to locations of sensing subpixels according to aspects of the present disclosure.

Referring to FIG. 9, a plurality of sensing subpixel arrays SSP for detecting the driving temperature may be disposed in the non-display area NDA of the display panel 110 in the display apparatus 100 according to aspects of the present disclosure.

FIG. 9 illustrates an example in which eight sensing subpixels SSP1-SSP8 are disposed in four corner areas and four side areas between the four corner areas in the non-display areas of the display panel 110, but aspects of the present disclosure are not limited thereto.

For example, sensing subpixels may be disposed in at least one corner area of the display panel 110. For example, the sensing subpixels may be disposed in at least one of the areas between at least one corner area and at least another corner area of the display panel 110. For example, the first sensing subpixel SSP1 may be disposed at an upper left corner area, the second sensing subpixel SSP2 may be disposed at a left central area, and the third sensing subpixel SSP3 may be disposed at a lower left corner area. A fourth sensing subpixel SSP4 may be disposed at a lower central area, a fifth sensing subpixel SSP5 may be disposed at a lower right corner area, and a sixth sensing subpixel SSP6 may be disposed at a right central area. A seventh sensing subpixel SSP7 may be disposed at an upper right corner area, and an eighth sensing subpixel SSP8 may be disposed at an upper central area.

Accordingly, the first sensing subpixel SSP1 may detect a driving temperature of the first area A1 corresponding to an upper left portion of the display panel 110. The second sensing subpixel SSP2 may detect a driving temperature of the second area A2 corresponding to a left central portion of the display panel 110, and the third sensing subpixel SSP3 may detect a driving temperature of the third area A3 corresponding to a lower left portion of the display panel 110.

The fourth sensing subpixel SSP4 may detect a driving temperature of the fourth area A4 corresponding to a lower central portion of the display panel 110. The fifth sensing subpixel SSP5 may detect a driving temperature of the fifth area A5 corresponding to a lower right portion of the display panel 110, and the sixth sensing subpixel SSP6 may detect a driving temperature of the sixth area A6 corresponding to a right central portion of the display panel 110.

The seventh sensing subpixel SSP7 may detect a driving temperature of the seventh area A7 corresponding to an upper right portion of the display panel 110. The eighth sensing subpixel SSP8 may detect a driving temperature of the eights area A8 corresponding to an upper central portion of the display panel 110.

Since a sensing subpixel may not be disposed in the ninth area A9 corresponding to a center of the display panel 110, the driving temperature of the ninth area A9 may be calculated by the driving temperature of the first area A1 to the driving temperature of the eighth area A8. For example, the driving temperature of the ninth area A9 may be calculated as the average value of the driving temperatures of the first area A1 to the eighth area A8. As another example, it may be calculated as the average value of the driving temperature of the first area A1 and the driving temperature of the fifth area A5 or as the average value of the driving temperature of the third area A3 and the driving temperature of the seventh area A7.

The display apparatus 100 of the present disclosure may detect the driving temperature of the display panel 110 by an electrical characteristics of the sensing subpixel SSP disposed at the non-display area NDA of the display panel 110.

Figure 10:
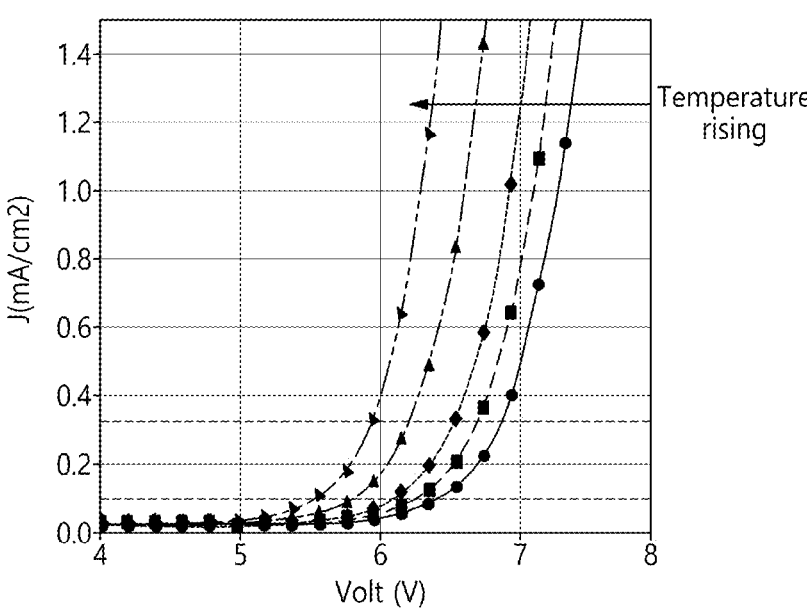
FIG. 10 is a graph illustrating changes in electrical characteristics depending on a temperature of a light emitting element according to aspects of the present disclosure.

FIG. 10 is a graph illustrating changes in electrical characteristics based on a temperature of a light emitting element according to aspects of the present disclosure.

In FIG. 10, a horizontal axis is the threshold voltage (V), and a vertical axis is the current density (J (mA/cm2). In FIG. 10, a solid line is the voltage and current density when the temperature of the light emitting element is 25° C., and a dotted line is the voltage and current density when the temperature of the light emitting element is 35° C. A thin solid line is the voltage and current density when the temperature of the light emitting element is 45° C., and a dashed line is the voltage and current density when the temperature of the light emitting element is 65° C. A double dashed line is the voltage and current density when the temperature of the light emitting element is 85° C. The current density is a measured value when the current is 0.1 mA.

Referring to FIG. 10, the threshold voltage of the light emitting element decreases as the environmental temperature (or external temperature) increases. When the temperature of the light emitting element is 25° C., the threshold voltage is 6.3 V, and when the temperature of the light emitting element is 35° C., the threshold voltage is 6.2 V. When the temperature of the light emitting element is 45° C., the threshold voltage is 6.1 V, when the temperature of the light emitting element is 65° C., the threshold voltage is 5.8 V, and when the temperature of the light emitting element is 85° C., the threshold voltage is 5.5 V.

Referring to FIG. 10, the light emitting element ED constituting the unit subpixel USP or the sensing subpixel SSP in the display apparatus 100 according to aspects of the present disclosure may have an electrical characteristic where the current density J (mA/cm2) increases based on the voltage supplied to the anode electrode.

In the light emitting element ED, little current flows until the voltage supplied to the anode electrode reaches the threshold voltage, but when the voltage higher than the threshold voltage is supplied to the anode electrode, the current may rapidly increase.

When the driving temperature of the subpixel SP including the light emitting element ED increases, the threshold voltage of the light emitting element ED may decrease and the current flowing through the light emitting device ED may increase. Therefore, the threshold voltage of the light emitting element ED may have an inverse relationship with the driving temperature.

In other words, as the temperature of an area where the light emitting element ED is disposed increases (temperature rising), the threshold voltage of the light emitting element ED decreases, so that current may flow to the light emitting element ED even by a low voltage.

The same type of light emitting element ED will show almost the same change in threshold voltage based on the driving temperature.

Therefore, the threshold voltages of the light emitting element ED depending on temperatures may be stored in the form of a look-up table, and the driving temperature corresponding to the threshold voltage of the light emitting element ED may be calculated by the look-up table.

Therefore, the display apparatus 100 of the present disclosure may detect the threshold voltage of the light emitting element ED constituting the sensing subpixel SSP disposed at the non-display area NDA, and calculate the driving temperature of the display panel 110.

Figure 11:
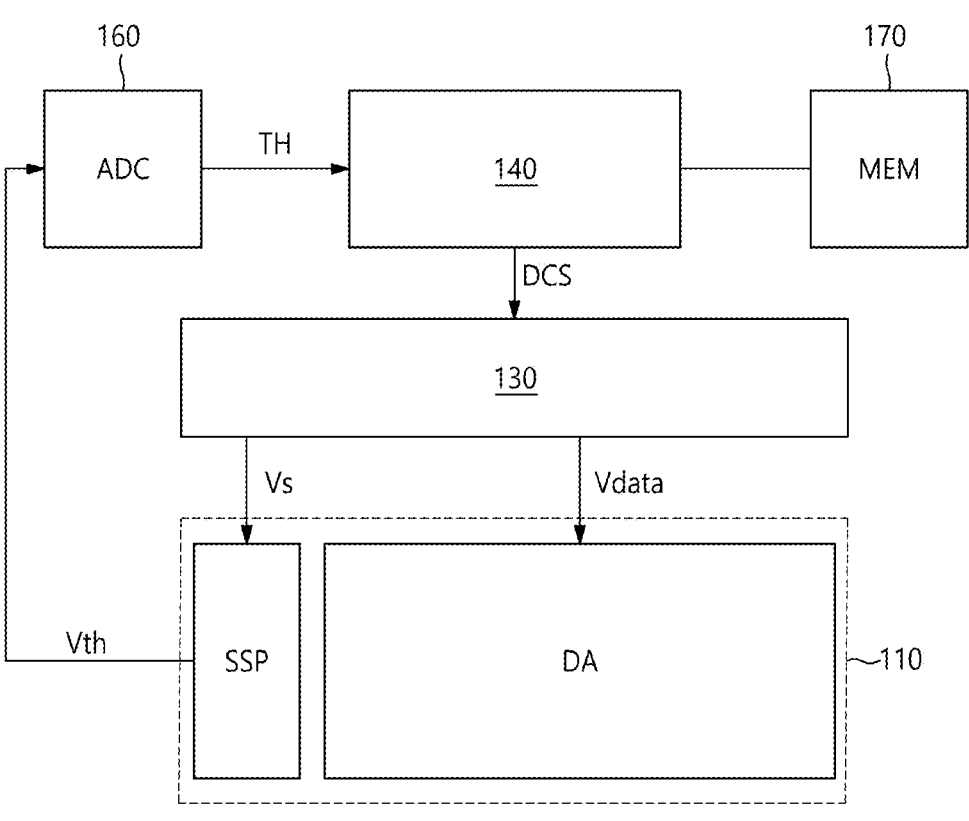
FIG. 11 is a block diagram of compensating temperature of a display panel according to aspects of the present disclosure.

FIG. 11 is a block diagram of compensating temperature of a display panel according to aspects of the present disclosure.

Referring to FIG. 11, the display apparatus 100 according to aspects of the present disclosure may include a display panel 110, a data driving circuit 130, and a timing controller 140.

A plurality of unit subpixels configured to display an image may be disposed at the display area DA of the display panel 110. A plurality of sensing subpixels SSP may be disposed at the non-display area NDA of the display panel 110. For example, a plurality of sensing subpixels SSP configured to detect temperatures may be disposed at the non-display area NDA corresponding to the outside of the display area DA.

The plurality of sensing subpixels SSP may be disposed at locations configured to detect the temperature of the display panel 110. For example, as shown in FIG. 7, the sensing subpixels SSPs may be disposed at four corner areas and four side central areas of the display panel 110, but aspects of the present disclosure are not limited thereto.

The data driving circuit 130 may control emission of the display panel 110. The data driving circuit 130 may control the unit subpixels to emit designated colors by supplying data voltages Vdata to the unit subpixels disposed in the display area DA under the control of the timing controller 140.

The data driving circuit 130 may supply a sensing voltage Vs to the sensing subpixel SSP and detect the threshold voltage Vth of the light emitting element ED constituting the sensing subpixel SSP under the control of the timing controller 140.

Here, it illustrates a case where the sensing voltage Vs operating the sensing subpixel SSP is supplied from the data driving circuit 130 as an example, but the sensing voltage may be supplied from an integrated circuit that generates a driving voltage, such as a power management circuit.

The threshold voltage Vth of the sensing subpixel SSP may be converted to a digital threshold value TH through the analog-to-digital converter 160.

The temperatures corresponding to the threshold voltages of the light emitting element ED may be stored in the memory 170 in the form of a look-up table.

The timing controller 140 may detect the threshold voltage Vth of the sensing subpixel SSP, calculates the temperature, and control the data voltage Vdata supplied from the data driving circuit 130 depending on the temperature. The timing controller 140 may extract the temperature corresponding to the digital threshold value TH of the sensing subpixel SSP from the memory 170. The timing controller 140 may apply a compensation value to the image data DATA so that the data voltage Vdata supplied to the corresponding area is compensated based on the temperature of the display panel 110 in the area where the sensing subpixel SSP is disposed.

Figure 12:
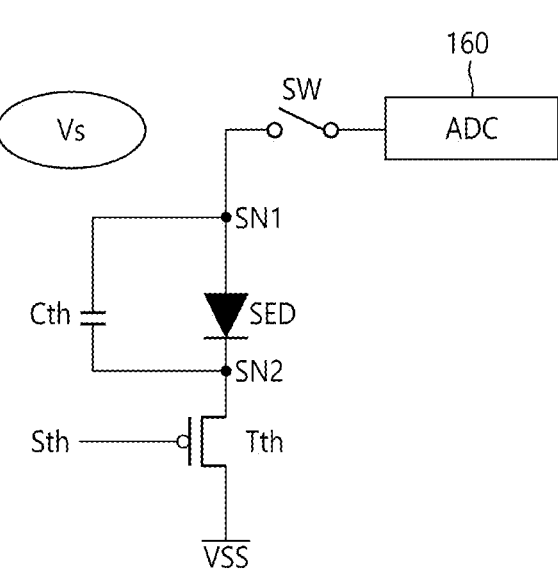
FIG. 12 illustrates a configuration of a sensing subpixel according to aspects of the present disclosure.

FIG. 12 illustrates a configuration of a sensing subpixel according to aspects of the present disclosure.

Referring to FIG. 12, the sensing subpixel SSP disposed at the non-display area NDA of the display apparatus 100 according to aspects of the present disclosure may include a sensing light emitting element SED, a sensing capacitor Cth, a control transistor Tth, and a sampling switch SW.

An anode electrode of the sensing light emitting element SED may be the first sensing node SN1, and a cathode electrode may be the second sensing node SN2.

A sensing voltage Vs may be supplied to the first sensing node SN1, and the sensing light emitting element SED may be turned on or off based on a level of the sensing voltage Vs.

The sensing light emitting element SED may have a same structure as the light emitting element ED in the unit subpixel of the display area DA, but aspects of the present disclosure are not limited thereto.

The sensing capacitor Cth may be connected between the first sensing node SN1 and the second sensing node SN2. Accordingly, a voltage formed between the anode electrode SN1 and the cathode electrode SN2 of the sensing light emitting element SED may be stored in the sensing capacitor Cth. For example, when the sensing light emitting element SED changes from the turned-on state to the turned-off state, the threshold voltage of the sensing light emitting element SED may be stored in the sensing capacitor Cth.

For the control transistor Tth, a source electrode (or drain electrode) may be connected to the second sensing node SN2, a drain electrode (or source electrode) may be connected to a base voltage node supplying a base voltage VSS, and a gate electrode may receive a control signal Sth.

The base voltage VSS may be a ground voltage or a minus level voltage.

The control transistor Tth may be a P-type transistor or an N-type transistor. Here, it illustrates a case where the control transistor Tth is a P-type transistor as an example. But aspects of the present disclosure are not limited thereto.

Therefore, when the control transistor Tth is turned on by the control signal Sth, the sensing current flowing through the sensing light emitting element SED may be transmitted to the base voltage node.

The threshold voltage of the sensing light emitting element SED may be detected through the first sensing node SN1 or the second sensing node SN2. Here, it illustrates a case of detecting the threshold voltage of the sensing light emitting element SED through the first sensing node SN1 as an example. But aspects of the present disclosure are not limited thereto.

The sampling switch SW may be located between the first sensing node SN1 and the analog-to-digital converter 160. The sampling switch SW may transmit the voltage of the first sensing node SN1 to the analog-to-digital converter 160 at the time of detecting the threshold voltage of the sensing light emitting element SED.

The sampling switch SW may be disposed at the non-display area NDA where the sensing light emitting element SED is located, or may be disposed on the printed circuit board including the analog-to-digital converter 160, but aspects of the present disclosure are not limited thereto.

Figure 13:
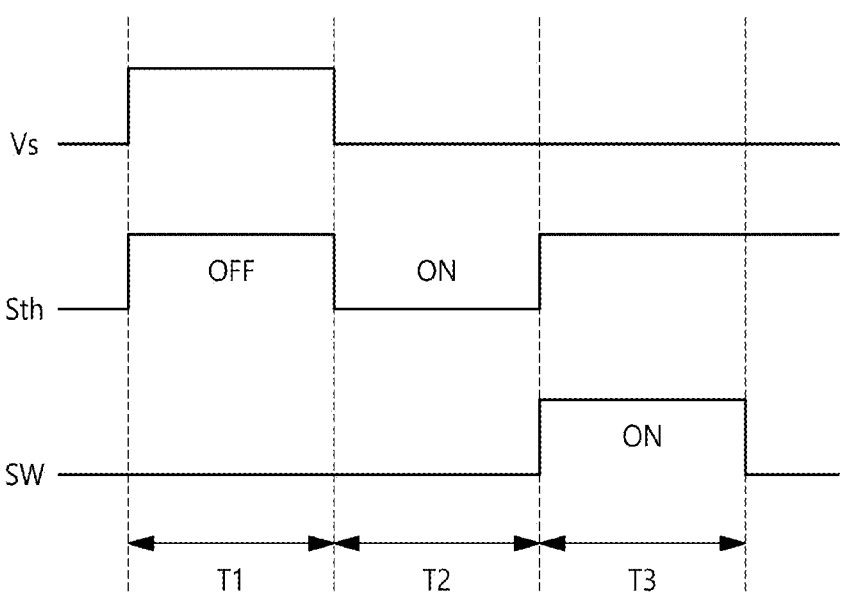
FIG. 13 is a signal waveform illustrating a process of detecting a threshold voltage of a sensing subpixel according to aspects of the present disclosure.
Figure 14:
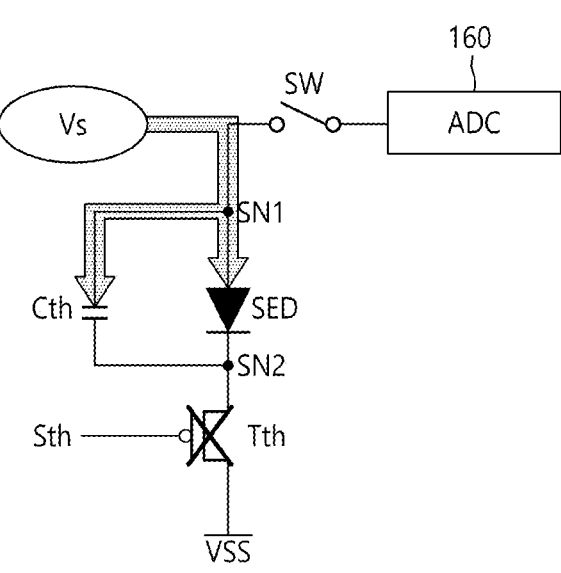
FIGS. 14 to 16 illustrate an operation of a sensing subpixel according to aspects of the present disclosure.
Figure 15:
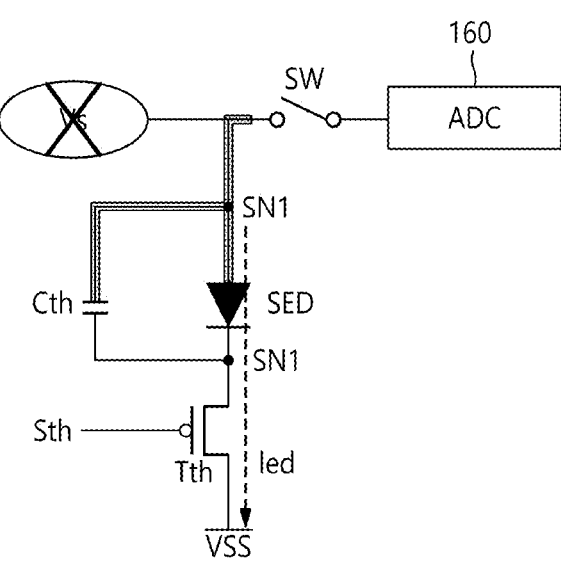
Figure 16:
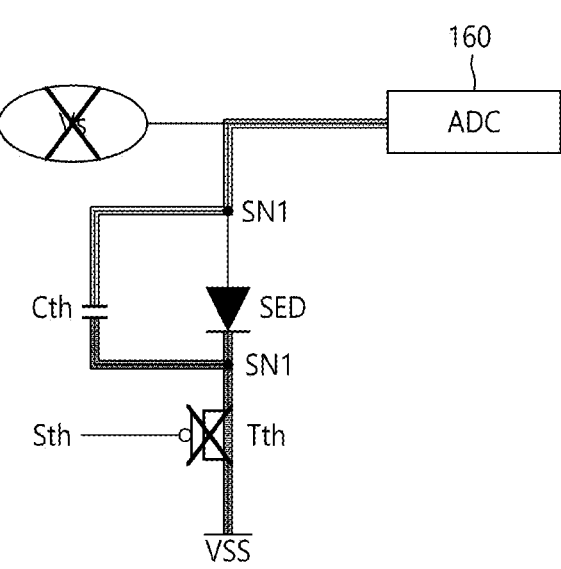

FIG. 13 is a signal waveform illustrating a process of detecting a threshold voltage of a sensing subpixel according to aspects of the present disclosure. FIGS. 14 to 16 illustrate the operation of the sensing subpixel according to aspects of the present disclosure.

Referring to FIG. 13, the display apparatus 100 according to aspects of the present disclosure may operate in a first period T1, a second period T2, and a third period T3.

In the first period T1, a high-level sensing voltage Vs capable of turning on the sensing light emitting element SED may be supplied. By allowing a sensing current to flow through the sensing light emitting element SED in the second period T2, the threshold voltage of the sensing light emitting element SED may be stored in the sensing capacitor Cth. The threshold voltage of the sensing light emitting element SED may be detected in the third period T3.

Referring to FIGS. 13 and 14 together, the display apparatus 100 of the present disclosure may supply a high-level sensing voltage Vs capable of turning on the sensing light emitting element SED to the first sensing node SN1 corresponding to the anode electrode of the sensing light emitting element SED in the first period T1.

Accordingly, the high-level sensing voltage Vs capable of turning on the sensing light emitting element SED may be supplied to the sensing capacitor Cth and the anode electrode of the sensing light emitting element SED through the first sensing node SN1.

In the first period T1, since the sampling switch SW and the control transistor Tth maintain a turn-off state, the sensing current may not flow through the sensing light emitting element SED.

Referring to FIGS. 13 and 15 together, the display apparatus 100 of the present disclosure may block the sensing voltage Vs and may supply a control signal Sth capable of turning on the control transistor Tth in the second period T2. Further, the sampling switch SW may maintain the turn-off state.

Accordingly, the sensing current led flows through the sensing light emitting element SED and the control transistor Tth in the second period T2, so that the sensing light emitting element SED emits light.

Since the sensing voltage Vs is not supplied, the sensing light emitting element SED emits light only for a certain period of time and may be turned off thereafter.

At the time when the sensing light emitting element SED is turned off, a voltage corresponding to the threshold voltage of the sensing light emitting element SED may be stored in the sensing capacitor Cth.

The third period T3 may proceed when the sensing light emitting element SED is turned off.

Referring to FIGS. 13 and 16 together, the display apparatus 100 of the present disclosure may detect the threshold voltage of the sensing light emitting element SED stored in the sensing capacitor Cth by turning on the sampling switch SW in the third period T3.

The control transistor Tth may be turned off or may remain turned on in the third period T3. Here, it illustrates a case where the control transistor Tth is turned off in the third period T3 as an example, but aspects of the present disclosure are not limited thereto.

In the third period T3, the analog-to-digital converter 160 may convert the threshold voltage of the sensing light emitting element SED stored in the sensing capacitor Cth into a digital threshold value and transmit it to the timing controller 140.

The timing controller 140 may detect the temperature of the display panel 110 corresponding to the threshold voltage of the sensing light emitting element SED by referring to the lookup table stored in the memory 170. Accordingly, the timing controller 140 may apply a compensation value to the image data DATA to compensate the data voltage Vdata supplied to the corresponding area based on the temperature of the display panel 110 in the area where the sensing subpixel SSP is located.

Therefore, the display apparatus 100 of the present disclosure may accurately calculate the temperature of the display panel 110 by the threshold voltage of the light emitting element ED constituting the sensing subpixel SSP disposed at the non-display area NDA.

The display apparatus 100 of the present disclosure may provide not only an image display function but also a touch sensing function.

Figure 17:
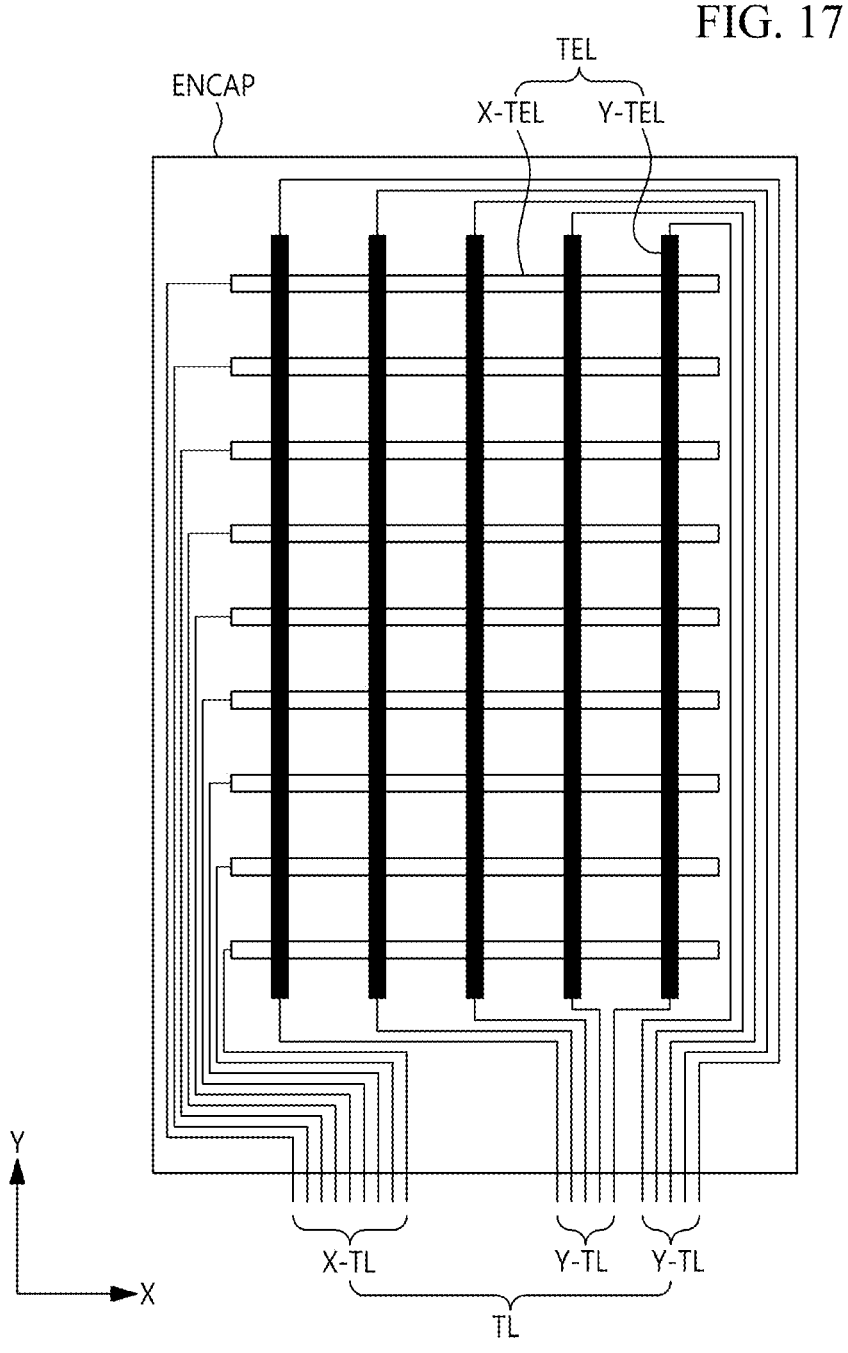
FIG. 17 illustrates a touch electrode structure in a display apparatus according to aspects of the present disclosure.

FIG. 17 illustrates a touch electrode structure in a display apparatus according to aspects of the present disclosure.

Referring to FIG. 17, the display apparatus 100 according to aspects of the present disclosure may have a touch electrode structure for mutual capacitance-based touch sensing. For example, the touch electrode structure may include a plurality of X-touch electrode lines X-TEL and a plurality of Y-touch electrode lines Y-TEL. The plurality of X-touch electrode lines X-TEL and the plurality of Y-touch electrode lines Y-TEL are located on the encapsulation layer ENCAP, but aspects of the present disclosure are not limited thereto.

The plurality of X-touch electrode lines X-TEL each may be disposed in a first direction, and the plurality of Y-touch electrode lines Y-TEL each may be disposed in a second direction different from the first direction.

In the present disclosure, the first direction and the second direction may be relatively different directions. As an example, the first direction may be the x-axis direction, and the second direction may be the y-axis direction. In contrast, the first direction may be the y-axis direction, and the second direction may be the x-axis direction. The first direction and the second direction may be, or may not be, perpendicular to each other. In the present disclosure, row and column are relative terms, and from a point of view, the terms "row" and "column" may be interchangeably used.

Each of the X-touch electrode lines X-TEL may be constituted of a plurality of X-touch electrodes electrically connected with each other. Each of the Y-touch electrode lines Y-TEL may be constituted of a plurality of Y-touch electrodes electrically connected with each other.

The plurality of X-touch electrodes and the plurality of Y-touch electrodes are included in the plurality of touch electrodes TE and whose roles (functions) are distinguished.

For example, the plurality of X-touch electrodes respectively constituting the plurality of X-touch electrode lines X-TEL may be driving touch electrodes, and the plurality of Y-touch electrodes respectively constituting the plurality of Y-touch electrode lines Y-TEL may be sensing touch electrodes. In this case, the plurality of X-touch electrode lines X-TEL respectively correspond to driving touch electrode lines, and the plurality of Y-touch electrode lines Y-TEL respectively correspond to sensing touch electrode lines.

In another example, the plurality of X-touch electrodes respectively constituting the plurality of X-touch electrode lines X-TEL may be sensing touch electrodes, and the plurality of Y-touch electrodes respectively constituting the plurality of Y-touch electrode lines Y-TEL may be driving touch electrodes. In this case, the plurality of X-touch electrode lines X-TEL respectively correspond to sensing touch electrode lines, and the plurality of Y-touch electrode lines Y-TEL respectively correspond to driving touch electrode lines.

A touch sensor metal for touch sensing may include a plurality of touch lines TL as well as the plurality of X-touch electrode lines X-TEL and the plurality of Y-touch electrode lines Y-TEL.

The plurality of touch lines TL may include one or more X-touch lines X-TL respectively connected to the plurality of X-touch electrode lines X-TEL and one or more Y-touch lines Y-TL respectively connected to the plurality of Y-touch electrode lines Y-TEL.

Figure 18:
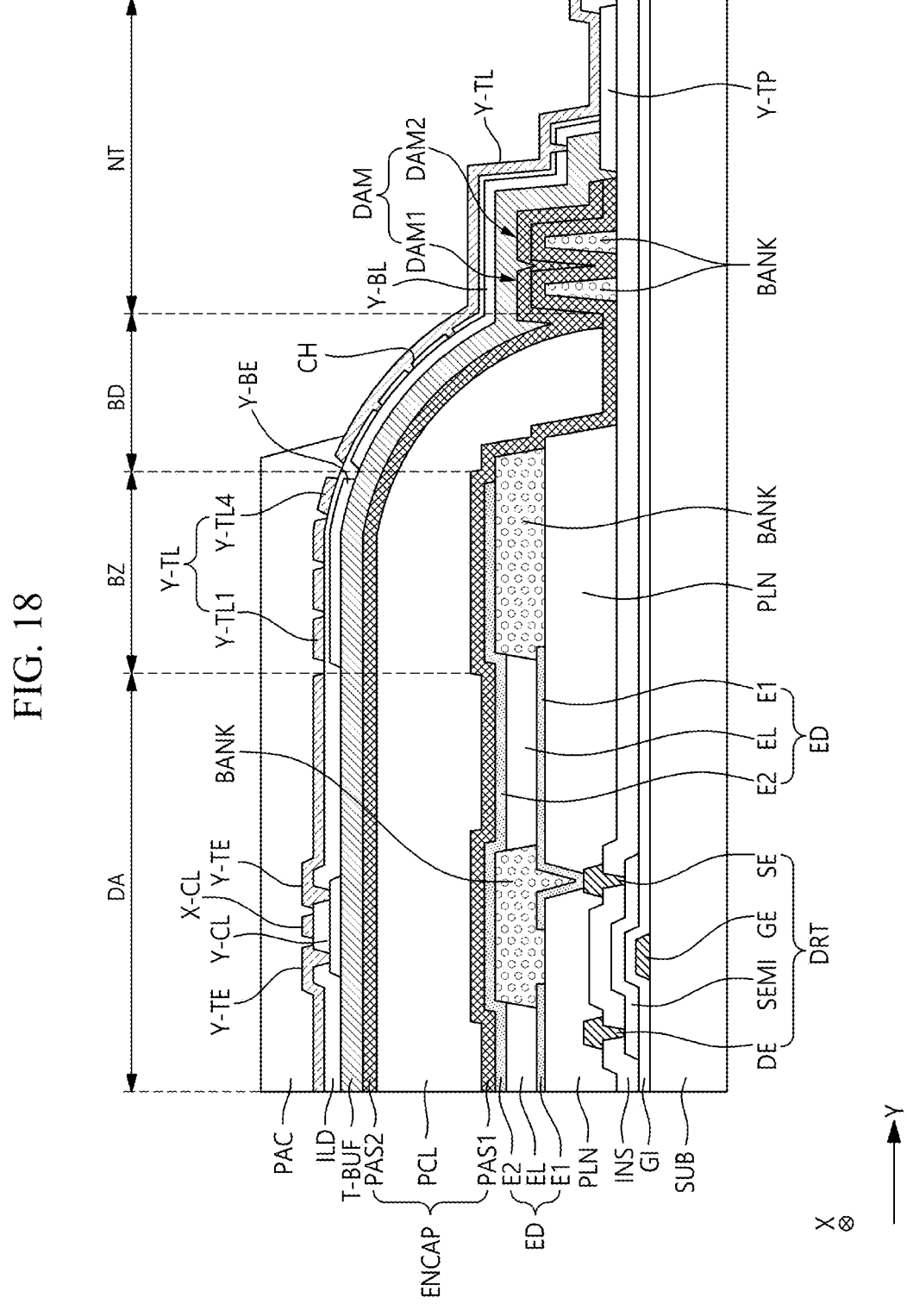
FIG. 18 is a cross-sectional view exemplarily illustrating a display apparatus according to aspects of the present disclosure.

FIG. 18 is a cross-sectional view exemplarily illustrating a display apparatus according to aspects of the present disclosure.

In the display apparatus 100 according to aspects of the present disclosure, a driving transistor DRT may be disposed on the substrate SUB in the subpixel SP located in the display area DA. In FIG. 18, only the driving transistor DRT is shown, but a switching transistor and a storage capacitor included in the subpixel may also be included.

The driving transistor DRT may include a gate electrode GE, a source electrode SE, a drain electrode DE, and a semiconductor layer SEMI.

The gate electrode GE and the semiconductor layer SEMI may overlap each other, with the gate insulation film GI interposed therebetween. The source electrode SE may be formed on an insulation layer INS to contact one portion of the semiconductor layer SEMI, and the drain electrode DE may be formed on the insulation layer INS to contact the other portion of the semiconductor layer SEMI. For example, the semiconductor layer may include an oxide semiconductor layer or a low-temperature polysilicon semiconductor layer, but aspects of the present disclosure are not limited thereto.

The light emitting element ED may include a first electrode E1, which corresponds to the anode electrode (or cathode electrode), an emission layer EL formed on the first electrode E1, and a second electrode E2 formed on the emission layer EL and corresponding to the cathode electrode (or anode electrode).

The first electrode E1 may be electrically connected with the source electrode SE of the driving transistor DRT, exposed through a contact hole which passes through a planarization film PLN.

The emission layer EL is formed on the first electrode E1 in an emission area defined by a bank BANK. The emission layer EL may be formed in the order of hole-related layer, emission layer, and electron-related layer, or its reverse order, on the first electrode E1. The second electrode E2 may be formed to face the first electrode E1, with the emission layer EL disposed therebetween. For example, the hole-related layer may be a hole transporting layer, a hole injecting layer, an electron blocking layer, or a P-type charge generation layer, but aspects of the present disclosure are not limited thereto. For example, the electron-related layer may be an electron transporting layer, an electron injecting layer, a hole blocking layer, or an N-type charge generation layer, but aspects of the present disclosure are not limited thereto.

The encapsulation layer ENCAP may block or reduce penetration of external moisture or oxygen into the light emitting element ED which is vulnerable to external moisture or oxygen. The encapsulation layer ENCAP may be formed of one layer or may include a stacked structure of a plurality of layers PAS1, PCL, and PAS2.

For example, where the encapsulation layer ENCAP is formed of a stacked structure of a plurality of layers PAS1, PCL, and PAS2, the encapsulation layer ENCAP may include one or more inorganic encapsulation layers PAS1 and PAS2 and one or more organic encapsulation layer PCL. For example, in the encapsulation layer ENCAP, the first inorganic encapsulation layer PAS1, the organic encapsulation layer PCL, and the second inorganic encapsulation layer PAS2 may be stacked in the order thereof, but aspects of the present disclosure are not limited thereto.

The encapsulation layer ENCAP may further include at least one organic encapsulation layer or at least one inorganic encapsulation layer, but aspects of the present disclosure are not limited thereto.

The first inorganic encapsulation layer PAS1 may be formed on the substrate SUB where the second electrode E2 corresponding to the cathode electrode is formed, to be disposed most adjacent to the light emitting element ED. The first inorganic encapsulation layer PAS1 may be formed of an inorganic insulation material capable of low-temperature deposition, such as silicon nitride (SiNx), silicon oxide (SiOx), silicon oxynitride (SiON), and aluminum oxide ($Al_2O_3$), but aspects of the present disclosure are not limited thereto. Since the first inorganic encapsulation layer PAS1 is deposed at low-temperature atmosphere, the first inorganic encapsulation layer PAS1 may prevent damage to the emission layer EL including the organic material vulnerable to high-temperature atmosphere during a deposition process.

The organic encapsulation layer PCL may be formed in a smaller area than the first inorganic encapsulation layer PAS1 in which case the organic encapsulation layer PCL may be formed to expose both end tips of the first inorganic encapsulation layer PAS1. The organic encapsulation layer PCL serves to mitigate stress between the layers due to a warping (or a sagging) of the display apparatus 100 and reinforcing the planarization performance. The organic encapsulation layer PCL may be formed of, e.g., an acrylic resin, epoxy resin, polyimide, polyethylene, silicon oxycarbide (SiOC), or other organic insulation materials, but aspects of the present disclosure are not limited thereto.

Where the organic encapsulation layer PCL is formed by an inkjet method, one or more dams DAM may be formed at the boundary area between the non-display area and the display area DA or the dam area which corresponds to a portion of the non-display area.

For example, the dam area may be disposed between the display area DA and the pad area where the plurality of touch pads are formed at the non-display area and, in the dam area, a primary dam DAM1 adjacent to the display area DA, and a secondary dam DAM2 adjacent to the pad area may exist.

The one or more dams DAM disposed at the dam area may prevent or reduce the liquid-state organic encapsulation layer PCL from collapsing to the non-display area and resultantly penetrating into the pad area when the liquid-phase of the organic encapsulation layer PCL is formed at the display area DA.

The primary dam DAM1 or the secondary dam DAM2 may be formed in a single-layer structure or multi-layer structure. For example, the primary dam DAM1 or the secondary dam DAM2 may simultaneously be formed of a same material as at least one of the bank BANK and a spacer. In this case, a dam structure may be formed without a masking process or an additional cost. For example, the spacer may be disposed on the bank BANK. For example, the BANK may be formed of a material including black pigment, or an organic material such as benzocyclobutene resin, polyimide resin, acrylic resin, or photosensitive polymer, but aspects of the present disclosure are not limited thereto. If the bank BANK is composed of a material including black pigment or black dye, the bank BANK may be a black bank. When the bank BANK is formed of a material including black pigment or black dye, light from the outside may be blocked and a luminance of the display apparatus may be further improved. For example, the spacer may be composed of a same material as the bank BANK, but aspects of the present disclosure are not limited thereto.

Further, the primary dam DAM1 or the secondary dam DAM2 may be structured so that the first inorganic encapsulation layer PAS1 and the second inorganic encapsulation layer PAS2 are stacked on the bank BANK. In this case, the organic encapsulation layer PCL containing an organic material may be positioned on an inner surface of the primary dam DAM1 or be positioned on an upper portion of at least a portion of the primary dam DAM1 and the secondary dam DAM2, but aspects of the present disclosure are not limited thereto.

The second inorganic encapsulation layer PAS2 may be formed over the substrate SUB, where the organic encapsulation layer PCL is formed, to cover upper surface and side surfaces of each of the organic encapsulation layer PCL and the first inorganic encapsulation layer PAS1. The second inorganic encapsulation layer PAS2 may reduce or block penetration of external moisture or oxygen into the first inorganic encapsulation layer PAS1 and the organic encapsulation layer PCL. The second inorganic encapsulation layer PAS2 may be formed of an inorganic insulation material, such as silicon nitride (SiNx), silicon oxide (SiOx), silicon oxynitride (SiON), and aluminum oxide ($Al_2O_3$), but aspects of the present disclosure are not limited thereto.

Each of a plurality of X-touch electrode lines may include a plurality of X-touch electrodes X-TE arranged in the same row (or column), and one or more X-touch electrode connection lines X-CL. The X-touch electrode connection line X-CL connecting two adjacent X-touch electrodes X-TE may be formed of metal integrated with the two adjacent X-touch electrodes X-TE or may be a metal connecting the two adjacent X-touch electrodes X-TE through a contact hole.

A touch part may be disposed on the encapsulation layer ENCAP. A buffer layer T-BUF may be disposed on the encapsulation layer ENCAP. The buffer layer T-BUF may be positioned between the touch sensor metal including the touch electrodes X-TE and Y-TE and the touch electrode connection lines X-CL and Y-CL, and the second electrode E2 of the light emitting element ED.

The buffer layer T-BUF may be designed to maintain a predetermined minimum spacing (or distance) (e.g., 1 μm) between the touch sensor metal and the second electrode E2 of the light emitting element ED. Thus, it is possible to reduce or prevent the parasitic capacitance formed between the touch sensor metal and the second electrode E2 of the light emitting element ED and hence reduce or prevent deterioration of touch sensitivity due to parasitic capacitance.

In another example, without the buffer layer T-BUF, the touch sensor metal including the touch electrodes X-TE and Y-TE and the touch electrode connection lines X-CL and Y-CL may be disposed on the encapsulation layer ENCAP.

The buffer layer T-BUF may block or reduce penetration, into the organic material-including emission layer EL, of external moisture or the chemical (e.g., developer or etchant) used while manufacturing the touch sensor metal disposed on the buffer layer T-BUF. Thus, the touch buffer layer T-BUF may prevent damage to the emission layer EL vulnerable to chemicals or moisture. Therefore, the buffer layer T-BUF may be formed to cover the touch sensor metal to prevent the touch sensor metal from being corroded by external moisture, etc.

The buffer layer T-BUF may be formed of an organic insulation material with a low permittivity and formed at a low temperature which is not more than a predetermined temperature (e.g., 100° C.) to prevent or at least reduce damage to the emission layer EL including the organic material vulnerable to high temperature. For example, the buffer layer T-BUF may be formed of an acrylic-based, epoxy-based, or siloxane-based material, but aspects of the present disclosure are not limited thereto. The buffer layer T-BUF with planarizability, formed of an organic insulation material, may prevent fracture of the touch sensor metal formed on the buffer film T-BUF and damage to the internal layers PAS1, PCL, and PAS2 constituting the encapsulation layer ENCAP due to a warping (or sagging) of the display apparatus. For another example, the buffer layer T-BUF may not be on the encapsulation layer ENCAP. For example, the buffer layer T-BUF may be omitted.

In a mutual-capacitance-based touch sensor structure, the X-touch electrode line X-TEL and the Y-touch electrode line Y-TEL may be formed on the buffer layer T-BUF, and the X-touch electrode line X-TEL and the Y-touch electrode line Y-TEL may be disposed to cross each other. The Y-touch electrode line Y-TEL may include a plurality of Y-touch electrode connection lines Y-CL that electrically connect the plurality of Y-touch electrodes Y-TE.

The plurality of Y-touch electrodes Y-TE and the plurality of Y-touch electrode connection lines Y-CL may be positioned on different layers, with the inter-layer dielectric ILD interposed therebetween.

The plurality of Y-touch electrodes Y-TE may be spaced apart at a predetermined interval along the y axis direction. The plurality of Y-touch electrodes Y-TE may be electrically connected with another Y-touch electrode Y-TE adjacent thereto in the y axis direction via the Y-touch electrode connection line Y-CL.

The Y-touch electrode connection line Y-CL may be formed on the touch buffer layer T-BUF. The Y-touch electrode connection line Y-CL may be exposed via the touch contact hole passing through the inter-layer dielectric ILD and be electrically connected with two Y-touch electrodes Y-TE adjacent in the y axis direction.

The Y-touch electrode connection line Y-CL may be disposed to overlap the bank BANK. Thus, it is possible to prevent or reduce a reduction in the aperture ratio of the display apparatus due to the Y-touch electrode connection line Y-CL.

The X-touch electrode line X-TEL may include a plurality of X-touch electrode connection lines X-CL that electrically connect the plurality of X-touch electrodes X-TE. The plurality of X-touch electrodes X-TE and the plurality of X-touch electrode connection lines X-CL may be positioned on different layers, with the inter-layer dielectric ILD disposed therebetween.

The plurality of X-touch electrodes X-TE may be spaced apart at a predetermined interval (or distance) along the x axis direction, on the inter-layer dielectric ILD. The plurality of X-touch electrodes X-TE may be electrically connected with another X-touch electrode X-TE adjacent thereto in the x axis direction via the X-touch electrode connection line X-CL.

The X-touch electrode connection line X-CL may be disposed on the same plane as the X-touch electrode X-TE and be electrically connected with two X-touch electrodes X-TE adjacent thereto in the x axis direction without a separate contact hole or be integrated with the two X-touch electrodes X-TE adjacent thereto each other in the x axis direction.

The X-touch electrode connection line X-CL may be disposed to overlap the bank BANK. Thus, it is possible to prevent a reduction in the aperture ratio of the display apparatus due to the X-touch electrode connection line X-CL.

The Y-touch electrode line Y-TEL may be electrically connected with the touch circuit 150 via the Y-touch line Y-TL and the Y-touch pad Y-TP. Likewise, the X-touch electrode line X-TEL may be electrically connected with the touch circuit 150 via the X-touch line X-TL and the X-touch pad (not shown).

A pad cover electrode may be further disposed to cover the X-touch pad and the Y-touch pad Y-TP.

The X-touch pad may be formed separately from the X-touch line X-TL or may extend from the X-touch line X-TL. The Y-touch pad Y-TP may be formed separately from the Y-touch line Y-TL or may extend from the Y-touch line Y-TL.

Where the X-touch pad extends from the X-touch line X-TL, and the Y-touch pad Y-TP extends from the Y-touch line Y-TL, the X-touch pad, the X-touch line X-TL, the Y-touch pad Y-TP, and the Y-touch line Y-TL may be formed of a same first conductive material. The first conductive material may be formed in a single-layer or multi-layer structure using a metal with good corrosion or acid resistance or electric conductivity, such as Aluminum (Al), titanium (Ti), copper (Cu), and molybdenum (Mo), but aspects of the present disclosure are not limited thereto.

For example, the X-touch pad, X-touch line X-TL, Y-touch pad Y-TP, and Y-touch line Y-TL formed of the first conductive material may be formed in a three-layer stacked structure, such as Ti/Al/Ti and Mo/Al/Mo, but aspects of the present disclosure are not limited thereto.

The pad cover electrode capable of covering the X-touch pad and Y-touch pad Y-TP may be formed of a second conductive material which is the same material as the X-touch electrode and Y-touch electrode X-TE and Y-TE. The second conductive material may be formed of a transparent conductive material, such as ITO and IZO, which has high corrosion or acid resistance. The pad cover electrode may be formed to be exposed by the buffer layer T-BUF, and thus, may be bonded (attached) with the touch driving circuit 150 or a circuit film where the touch driving circuit 150 is mounted.

The buffer layer T-BUF may be formed to cover the touch sensor metal, preventing or reducing corrosion to the touch sensor metal by external moisture. As an example, the buffer layer T-BUF may be formed of an organic insulation material or as a circular polarizer or epoxy or acrylic film. The buffer layer T-BUF on the encapsulation layer ENCAP may be omitted. For example, the buffer layer T-BUF may be omitted.

The Y-touch line Y-TL may be electrically connected with the Y-touch electrode via the touch line contact hole or be integrated with the Y-touch electrode Y-TE.

The Y-touch line Y-TL may extend up to the non-display area and be electrically connected with the Y-touch pad Y-TP via the top and side of the encapsulation layer ENCAP and the top and side of the dam DAM. Thus, the Y-touch line Y-TL may be electrically connected with the touch circuit 150 via the Y-touch pad Y-TP.

The Y-touch line Y-TL may transfer the touch sensing signal from the Y-touch electrode Y-TE to the touch circuit 150 or may receive the touch driving signal from the touch circuit 150 and transfer the touch driving signal to the Y-touch electrode Y-TE.

In the notch area NT and bending area BD, the Y-touch bridge line Y-BL connected through the contact hole CH may be disposed under the Y-touch line Y-TL. Since the Y-touch line Y-TL and the Y-touch bridge line Y-BL are electrically connected through at least one contact hole CH formed at regular intervals, the same touch driving signal or touch sensing signal may be transferred.

Therefore, when the Y-touch line Y-TL and the Y-touch bridge line Y-BL are electrically connected, the electrical resistance may be reduced during the transfer of the touch driving signal or the touch sensing signal. Further, when connecting the Y-touch line Y-TL and the Y-touch bridge line Y-BL through a plurality of contact holes CH, the touch signal (touch driving signal or touch sensing signal) may get around through the contact hole CH although a disconnection occurs in the Y-touch line Y-TL or Y-touch bridge line Y-BL in some section, so that the performance of touch sensing may be maintained.

The area other than the contact hole CH may be insulated by the inter-layer dielectric ILD disposed between the Y-touch line Y-TL and the Y-touch bridge line Y-BL.

A plurality of Y-touch lines Y-TL1, Y-TL2, Y-TL3, and Y-TL4 may be disposed in the bezel area BZ, and the Y-touch bridge electrode Y-BE having an integrated structure may be disposed thereunder.

The Y-touch bridge electrode Y-BE may have an integrated structure and be formed to have a same width or a larger width than the Y-touch lines Y-TL1, Y-TL2, Y-TL3, and Y-TLA to be able to cover the area occupied by the Y-touch lines Y-TL1, Y-TL2, Y-TL3, and Y-TL4 positioned thereabove.

The Y-touch bridge electrode Y-BE may be connected to a ground voltage GND to discharge the noise charge introduced into the display panel 110 and may be separated from the Y-touch bridge line Y-BL or the second node electrode NE2 positioned in the bending area BD.

Thus, the noise charge introduced to the display panel 110 may easily be discharged to the ground voltage GND by the Y-touch bridge electrode Y-BE formed in an integrated structure to be able to cover the area occupied by the Y-touch lines Y-TL1, Y-TL2, Y-TL3, and Y-TL4, so that the touch sensing performance of the display apparatus 100 may be reduced, and defects of the display driving may be reduced.

The X-touch line X-TL may be electrically connected with the X-touch electrode X-TE via the touch line contact hole or may be integrated with the X-touch electrode X-TE.

The X-touch line X-TL may extend up to the non-display area and be electrically connected with the X-touch pad via an upper portion and a side portion of the encapsulation layer ENCAP and the upper portion and the side portion of the dam DAM. Thus, the X-touch line X-TL may be electrically connected with the touch circuit 150 via the X-touch pad X-TP.

The X-touch line X-TL may receive the touch driving signal form the touch circuit 150 and transfer the touch driving signal to the X-touch electrode X-TE and may transfer the touch sensing signal from the X-touch electrode X-TE to the touch circuit 150.

Various changes may be formed to the arrangement of the X-touch line X-TL and the Y-touch line Y-TL depending on the design of the display panel 110.

A touch protection film PAC may be disposed on the X-touch electrode X-TE and the Y-touch electrode Y-TE. The touch protection film PAC may extend up to a front portion or a back portion of the dam DAM, and thus, may be disposed even over the X-touch line X-TL and the Y-touch line Y-TL.

The cross-sectional views in the FIG. 18 illustrate a conceptual structure of a touch display apparatus 100. Depending on the direction or position in which it is viewed, the position, thickness, or width of each pattern (e.g., various layers or electrodes) may be varied, and the connection structure of various patterns may be varied, and an additional layer other than the layers shown may be present as well, or some of the layers may be omitted or combined. For example, the width of the bank BANK may be narrower than that shown in the drawings, and the height of the dam DAM may be higher or lower than shown.

The display apparatus 100 may be used in mobile apparatus such as smartphones or tablet PCs, and may also be used in large-screen display apparatuses such as automobile displays and exhibition displays.

The display apparatus 100 may determine the presence or location of a touch by detecting a touch sensing signal transmitted from the touch electrode TE by a single sensing or differential sensing method.

The display apparatuses according to various aspects of the present disclosure may be applied to mobile apparatuses, video phones, smart watches, watch phones, wearable apparatus, foldable apparatus, rollable apparatus, bendable apparatus, flexible apparatus, curved apparatus, sliding apparatus, variable apparatus, electronic notebook, e-book, portable multimedia player (PMP), personal digital assistant (PDA), MP3 player, mobile medical apparatus, desktop PC, laptop PC, netbook computer, workstation, navigation, vehicle navigation, vehicle display apparatuses, vehicle apparatuses, theater apparatuses, theater display apparatuses, televisions, wallpaper apparatuses, signage apparatuses, game apparatuses, notebooks, monitors, cameras, camcorders, and home appliances, etc.

A display apparatus and a display panel according to aspects of the present disclosure are described below.

A display apparatus according to aspects of the present disclosure may comprise a display panel including a plurality of unit subpixels disposed in a display area and a plurality of sensing subpixels disposed in a non-display area, a data driving circuit configured to supply data voltages to the display panel, and a timing controller configured to detect temperatures of the display panel by threshold voltages sensed in the plurality of sensing subpixels and transmit image data applied compensation values based on the temperatures of the display panel.

According to aspects of the present disclosure, the plurality of unit subpixels may include a first subpixel with a first emission angle, and a second subpixel with a second emission angle. The first subpixel may emit a same color as the second subpixel.

According to aspects of the present disclosure, the plurality of sensing subpixels may be disposed in at least one corner area or at least one side area between the at least one corner area of the display panel.

According to aspects of the present disclosure, the timing controller may detect the temperatures of the at least one corner area or the at least one side area of the display panel by the threshold voltage sensed in the plurality of sensing subpixels. The temperature of the at least one side area of the display panel may be calculated by an average value of two or more of the threshold voltages sensed in the plurality of sensing subpixels.

According to aspects of the present disclosure, the plurality of sensing subpixels may include a light emitting element with an anode electrode connected to a first sensing node receiving a sensing voltage and a cathode electrode connected to a second sensing node, a capacitor connected between the first sensing node and the second sensing node, and a control transistor with a gate electrode receiving a control signal, a source electrode and a drain electrode connected to the second sensing node and a base voltage node.

According to aspects of the present disclosure, the plurality of sensing subpixels may further include a sampling switch connected between the first sensing node and an analog-to-digital converter. The timing controller may detect the temperatures of the display panel by digital threshold values transmitted through the analog-to-digital converter.

According to aspects of the present disclosure, the display apparatus may further comprise a memory in which the temperatures corresponding to the digital threshold values are stored in a form of a lookup table, wherein the timing controller determines the temperatures of the display panel corresponding to threshold voltages sensed in the plurality of sensing subpixels through the memory.

According to aspects of the present disclosure, the timing controller may operate in a first period in which the sensing voltage with a high-level is supplied to the first sensing node while the control transistor is turned off, a second period for blocking the sensing voltage, and turning on the control transistor by the control signal, and a third period for turning on the sampling switch while the light emitting element is turned off.

According to aspects of the present disclosure, the light emitting element may be formed in the same structure as a light emitting element constituting the unit subpixel.

According to aspects of the present disclosure, the sensing voltage may be supplied through the data driving circuit.

According to aspects of the present disclosure, the display apparatus may further comprise a black matrix disposed over the plurality of sensing subpixels.

According to aspects of the present disclosure, the display apparatus may further comprise a transistor in the display area, a light emitting element over the transistor, and an encapsulation layer over the light emitting element.

According to aspects of the present disclosure, the transistor may have a semiconductor layer that includes an oxide semiconductor layer or a low-temperature polysilicon semiconductor layer.

According to aspects of the present disclosure, the display apparatus may further comprise a touch part over the encapsulation layer.

According to aspects of the present disclosure, the light emitting element may include a first emission part and a second emission part between the first electrode and the second electrode. Each of the first emission part and the second emission part may include an emission layer that emits a same color.

A display panel according to aspects of the present disclosure may comprise a plurality of unit subpixels disposed in a display area, and a plurality of sensing subpixels disposed in a non-display area, wherein temperatures are detected using a threshold voltage sensed in the plurality of sensing subpixels, and data voltages compensated depending on the temperatures are supplied to the plurality of unit subpixels.

According to aspects of the present disclosure, the plurality of unit subpixels may include a first subpixel with a first emission angle and a second subpixel with a second emission angle. The first subpixel may emit a same color as the second subpixel.

According to aspects of the present disclosure, the plurality of sensing subpixels are disposed in at least one corner area or at least one side area between the at least one corner area.

According to aspects of the present disclosure, a temperature of the at least one corner area or the at least one side area may be detected by a threshold voltage sensed in the plurality of sensing subpixels. A temperature of the at least one side area may be calculated by an average value of two or more of the threshold voltages sensed in the plurality of sensing subpixels.

According to aspects of the present disclosure, the plurality of sensing subpixels may include a light emitting element having an anode electrode connected to a first sensing node receiving a sensing voltage and a cathode electrode connected to a second sensing node, a capacitor connected between the first sensing node and the second sensing node, and a control transistor having a gate electrode receiving a control signal, a source electrode and a drain electrode connected to the second sensing node and a base voltage node.

According to aspects of the present disclosure, the plurality of sensing subpixels may further include a sampling switch connected between the first sensing node and an analog-to-digital converter.

According to aspects of the present disclosure, the plurality of sensing subpixels may be configured to operate in: a first period in which the sensing voltage with a high-level is supplied to the first sensing node while the control transistor is turned off, a second period configured to block the sensing voltage, and turning on the control transistor by the control signal, and a third period configured to turn on the sampling switch while the light emitting element is turned off.

According to aspects of the present disclosure, the light emitting element may be configured in a same structure as a light emitting element constituting the unit subpixel.

According to aspects of the present disclosure, the display panel may further comprise a black matrix disposed over the plurality of sensing subpixel.

It will be apparent to those skilled in the art that various modifications and variations may be made in the present disclosure without departing from the scope of the disclosures. Thus, it is intended that the present disclosure covers the modifications and variations of this disclosure provided they come within the scope of the appended claims and their equivalents.

What is claimed:

1. A display apparatus, comprising:

a display panel including a plurality of unit subpixels disposed at a display area and a plurality of sensing subpixels disposed at a non-display area;

a data driving circuit configured to supply data voltages to the display panel; and a timing controller configured to detect temperatures of the display panel using threshold voltages sensed in the plurality of sensing subpixels and transmit image data applied compensation values based on the temperatures of the display panel, wherein the plurality of sensing subpixels include:

a light emitting element with an anode electrode connected to a first sensing node receiving a sensing voltage and a cathode electrode connected to a second sensing node;

a capacitor connected between the first sensing node and the second sensing node;

a control transistor with a gate electrode receiving a control signal, a source electrode and a drain electrode connected to the second sensing node and a base voltage node; and a sampling switch connected between the first sensing node and an analog-to-digital converter, wherein the timing controller detects the temperatures of the display panel by digital threshold values transmitted through the analog-to-digital converter, wherein the timing controller is configured to operate in:

a first period in which the sensing voltage with a high-level is supplied to the first sensing node while the control transistor is turned off;

a second period for blocking the sensing voltage, and turning on the control transistor by the control signal; and a third period for turning on the sampling switch while the light emitting element is turned off.

2. The display apparatus of claim 1, wherein the plurality of unit subpixels include:

a first subpixel with a first emission angle; and a second subpixel with a second emission angle, and wherein the first subpixel emits a same color as the second subpixel.

3. The display apparatus of claim 1, wherein the plurality of sensing subpixels are disposed in at least one corner area or at least one side area between the at least one corner area of the display panel.

4. The display apparatus of claim 3, wherein the timing controller detects the temperatures of the at least one corner area or the at least one side area of the display panel using the threshold voltage sensed in the plurality of sensing subpixels, and wherein the temperature of the at least one side area of the display panel is calculated using an average value of two or more of the threshold voltages sensed in the plurality of sensing subpixels.

5. The display apparatus of claim 1, further comprising a memory in which the temperatures corresponding to the digital threshold values are stored in a form of a lookup table, wherein the timing controller determines the temperatures of the display panel corresponding to threshold voltages sensed in the plurality of sensing subpixels through the memory.

6. The display apparatus of claim 1, wherein the light emitting element includes a same structure as a light emitting element constituting the unit subpixel.

7. The display apparatus of claim 1, wherein the sensing voltage is supplied through the data driving circuit.

8. The display apparatus of claim 1, further comprising a black matrix disposed over the plurality of sensing subpixels.

9. The display apparatus of claim 1, further comprising:

a transistor disposed in the display area;

a light emitting element disposed over the transistor; and an encapsulation layer disposed over the light emitting element.

10. The display apparatus of claim 9, wherein the transistor has a semiconductor layer that includes an oxide semiconductor layer or a low-temperature polysilicon semiconductor layer.

11. The display apparatus of claim 9, further comprising a touch part disposed over the encapsulation layer.

12. The display apparatus of claim 9, wherein the light emitting element includes a first emission part and a second emission part disposed between the first electrode and the second electrode, and wherein each of the first emission part and the second emission part includes an emission layer that emits a same color.

13. A display panel, comprising:

a plurality of unit subpixels disposed at a display area; and a plurality of sensing subpixels disposed at a non-display area, wherein temperatures are detected by a threshold voltage sensed in the plurality of sensing subpixels, and data voltages compensated depending on the temperatures are supplied to the plurality of unit subpixels, wherein the plurality of sensing subpixels include:

a light emitting element having an anode electrode connected to a first sensing node receiving a sensing voltage and a cathode electrode connected to a second sensing node;

a capacitor connected between the first sensing node and the second sensing node;

a control transistor having a gate electrode receiving a control signal, a source electrode and a drain electrode connected to the second sensing node and a base voltage node; and a sampling switch connected between the first sensing node and an analog-to-digital converter, wherein the plurality of sensing subpixels are configured to operate in:

a first period in which the sensing voltage with a high-level is supplied to the first sensing node while the control transistor is turned off;

a second period configured to block the sensing voltage, and turning on the control transistor by the control signal; and a third period configured to turn on the sampling switch while the light emitting element is turned off.

14. The display panel of claim 13, wherein the plurality of unit subpixels include:

a first subpixel with a first emission angle; and a second subpixel with a second emission angle, and wherein the first subpixel emits a same color as the second subpixel.

15. The display panel of claim 13, wherein the plurality of sensing subpixels are disposed in at least one corner area or at least one side area between the at least one corner area.

16. The display panel of claim 15, wherein a temperature of the at least one corner area or the at least one side area is detected by a threshold voltage sensed in the plurality of sensing subpixels, and wherein a temperature of the at least one side area is calculated by an average value of two or more of the threshold voltages sensed in the plurality of sensing subpixels.

17. The display panel of claim 13, wherein the light emitting element is configured in a same structure as a light emitting element constituting the unit subpixel.

18. The display panel of claim 13, further comprising a black matrix disposed over the plurality of sensing subpixels.

\* \* \* \* \*